US010431475B2

(12) United States Patent
Bandorawalla et al.

(10) Patent No.: US 10,431,475 B2
(45) Date of Patent: Oct. 1, 2019

(54) COLD PLATE WITH DAM ISOLATION

(71) Applicant: Intel Corporation, Santa Clara, CA (US)

(72) Inventors: Tozer J. Bandorawalla, Portland, OR (US); Mark E. Sprenger, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/595,765

(22) Filed: May 15, 2017

(65) Prior Publication Data
US 2018/0332734 A1 Nov. 15, 2018

(51) Int. Cl.
G06F 1/20 (2006.01)
H01L 21/48 (2006.01)
H01L 23/473 (2006.01)
H05K 1/02 (2006.01)

(52) U.S. Cl.
CPC .......... H01L 21/4882 (2013.01); G06F 1/20 (2013.01); H01L 23/473 (2013.01); H05K 1/0209 (2013.01); H05K 1/0272 (2013.01); H05K 2201/064 (2013.01)

(58) Field of Classification Search
CPC ... H05K 7/20254; H05K 1/0203; H05K 1/181
USPC .................... 361/702, 699, 704, 711, 697
See application file for complete search history.

(56) References Cited

U.S. PATENT DOCUMENTS

| 6,351,384 | B1 * | 2/2002 | Daikoku | F28F 3/02 |
| | | | | 165/80.3 |
| 6,402,158 | B1 * | 6/2002 | Imazaike | F16C 33/7846 |
| | | | | 277/549 |
| 6,637,452 | B1 * | 10/2003 | Alman | F16K 3/243 |
| | | | | 137/244 |
| 9,865,522 | B2 * | 1/2018 | Campbell | H01L 23/473 |
| 2005/0151244 | A1 * | 7/2005 | Chrysler | H01L 23/473 |
| | | | | 257/713 |

(Continued)

FOREIGN PATENT DOCUMENTS

JP 3946018 B2 7/2007
JP 2010-103365 A 5/2010

(Continued)

OTHER PUBLICATIONS

International Search Report and Written Opinion dated Jul. 31, 2018 for International Patent Application No. PCT/US2018/027364, 13 pages.

Primary Examiner — Mandeep S Buttar
(74) Attorney, Agent, or Firm — Schwabe, Williamson & Wyatt, P.C.

(57) ABSTRACT

Apparatuses, systems and methods associated with design of cold plates for cooling electrical systems are disclosed herein. In embodiments, a cold plate may include a base and a lid affixed to a side of the base via a braze joint, wherein the braze joint may extend around a perimeter of the lid. The lid may include a dam having a perimeter located inside of the perimeter of the lid, wherein the dam may be compressed against the side of the base and may be liquid-tight to the side of the base, and wherein a cavity may be located between the base and the lid within the perimeter of the dam to provide a circulation passage for a liquid coolant. Other embodiments may be described and/or claimed.

18 Claims, 14 Drawing Sheets

(56) References Cited

U.S. PATENT DOCUMENTS

| | | | |
|---|---|---|---|
| 2007/0109739 A1* | 5/2007 | Stefanoski | G06F 1/187 361/679.47 |
| 2007/0131459 A1* | 6/2007 | Voronin | B22F 7/062 175/426 |
| 2008/0130223 A1* | 6/2008 | Nakamura | H02M 7/003 361/689 |
| 2013/0228322 A1* | 9/2013 | Yasuda | B23K 1/0012 165/185 |

FOREIGN PATENT DOCUMENTS

| | | |
|---|---|---|
| JP | 2013-110357 A | 6/2013 |
| JP | 2016-219571 A | 12/2016 |
| WO | WO 2014-125548 A1 | 8/2014 |

\* cited by examiner

COLD PLATE WITH DAM ISOLATION

TECHNICAL FIELD

The present disclosure relates to the field of electronic circuits. More particularly, the present disclosure relates to the design of cold plates for cooling electrical systems.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A legacy procedure for producing a cold plate includes affixing a first piece (commonly referred to as 'a lid') of the cold plate to a second piece (commonly referred to as 'a base') of the cold plate. Affixing the lid to the base formed a cavity between the lid and the base through which a liquid coolant may be circulated to conduct heat away from the cold plate.

A legacy procedure for affixing the lid to the base typically involves brazing the lid to the base to generate a braze joint that affixes the lid to the base. Due to the characteristics of the materials, the braze joint is typically formed of a different material than the lid and the base, where the material of the braze joint occupies a different position on the galvanic series than the material of the lid and the base. The liquid circulated through the cavity is normally selected to minimize corrosion of the lid and base, but would result in galvanic corrosion of the braze joint. Further, portions of the braze joint that were corroded often would become lodged within the cavity and/or the coolant system, negatively affecting the cooling capabilities of the cold plate and/or the coolant system.

One legacy approach to addressing the issue involves mixing corrosion eliminators into the liquid circulated through the cavity. However, the corrosion eliminators are typically paired with a certain brazing material and fail to prevent corrosion when used with other brazing materials. Different manufacturers make use of different brazing materials, making it difficult, if not impossible, to select a corrosion eliminator that works with all cold plates on the market. Further, certain corrosion eliminators would become lodged within the cavity, such as within spaces produced by fins of the cold plate that may extend into the cavity.

Another legacy approach involves welding the lid and base together rather than brazing. Welding tends to be time consuming and not cost-effective. A final legacy approach uses gaskets or O-rings to affix the lid to the base rather than brazing. The inclusion of the gaskets or O-rings introduces a wet break, which is viewed as undesirable in an enclosure that could be a fire hazard.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
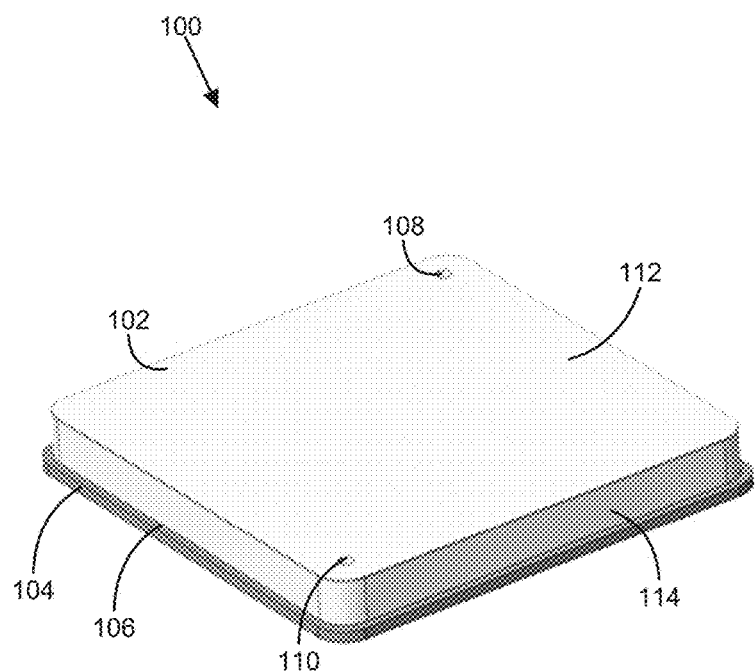
FIG. 1 illustrates an example assembled cold plate, according to various embodiments.

Apparatuses, systems and methods associated with design of cold plates for cooling electrical systems are disclosed herein. In embodiments, a cold plate may include a base and a lid affixed to a side of the base via a braze joint, wherein the braze joint may extend around a perimeter of the lid. The lid may include a dam having a perimeter located inside of the perimeter of the lid, wherein the dam may be compressed against the side of the base and may be liquid-tight to the side of the base, and wherein a cavity may be located between the base and the lid within the perimeter of the dam to provide a circulation passage for a liquid coolant. Other embodiments may be described and/or claimed.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example assembled cold plate 100, according to various embodiments. The cold plate 100 may include a lid 102 and a base 104. The lid 102 and the base 104 may be formed a first material. The first material may be a thermally conductive material, such as copper, aluminum, silver, silver/copper alloy, alloys thereof, or some combination thereof. The lid 102 may be affixed to the base 104 via a braze joint 106 formed along a perimeter of the lid 102. Further, the cold plate 100 may include a dam (not visible in FIG. 1, see e.g., 704 of FIG. 7) formed between a surface of the lid 102 and a surface of the base 104 to protect the braze joint 106.

The braze joint 106 may be formed along a perimeter of the lid 102, wherein the perimeter of the lid 102 abuts the base 104 when assembled. The braze joint 106 may extend around an entirety of the perimeter of the lid 102 and may couple the entirety of the perimeter of the lid 102 to the base 104. A perimeter of the base 104 may be larger than the perimeter of the lid 102, such that the perimeter of the lid 102 abuts a side of the base 104 and a portion of the base 104 extends beyond the perimeter of the lid 102.

In other embodiments, the braze joint 106 may extend around a portion of the perimeter of the lid 102 and may couple the portion of the perimeter of the lid 102 to the base 104. In these embodiments, the remaining portion of the perimeter of the lid 102 may abut the base 104, but the braze joint 106 may not directly affix the remaining portion of the perimeter of the lid 102 to the base 104.

The braze joint 106 may be formed of a second material. The second material may be a different material than the first material and may be selected to have a lower melting temperature than the first material. The second material may be silver, copper, zinc, phosphorus, gold, nickel, palladium, nickel, alloys thereof, or some combination thereof. The second material may occupy a different position on the galvanic series or the electropotential series than occupied by the first material.

The lid 102 may include a top surface 112 that extends parallel to the base 104 and one or more side walls 114 that extend substantially perpendicular (within 5 degrees) from the top surface 112 to the perimeter of the lid 102. In other embodiments, the one or more side walls 114 may extend from the top surface 112 at an angle between zero degrees and 90 degrees to the perimeter of the lid 102.

The lid 102 may include one or more apertures, such as first aperture 108 and second aperture 110. The apertures may be formed in the top surface 112 of the lid 102 and may extend to a cavity (as is described further throughout this disclosure) formed between the lid 102 and the base 104. In other embodiments, the apertures may be formed in the sidewalls 114 or a portion of the apertures may be formed in the sidewalls 114 and another portion of the apertures may be formed in the top surface 112.

While the cold plate 100 is illustrated being square with curved corners, it is to be understood that the cold plate 100 may be different shapes, including, but not limited to being rectangular, circular, oval-shaped, or some combination thereof.

One or more coolant tubes of a coolant system may be coupled to the apertures and may circulate liquid coolant through the cavity (as is described further throughout this disclosure) formed between the lid 102 and the base 104. (Hereinafter, liquid coolant may simply be referred to as liquid and/or coolant. These terms are to be considered synonymous. Further, the liquid coolant may be in liquid or vapor phase.) In the illustrated embodiment, the first aperture 108 may be coupled to an inflow coolant tube that feeds liquid into the cavity via the first aperture 108 and the second aperture 110 may be coupled to an outflow coolant tube that draws liquid from the cavity via the second aperture 110. The liquid may be circulated through the cavity due to the inflow coolant tube feeding the liquid into the cavity and the outflow coolant tube drawing the liquid from the cavity. The dam formed between the surface of the lid and the surface of the base 104 may prevent the liquid from contacting the braze joint 106, thereby protecting the braze joint 106 from galvanic corrosion that may occur from the liquid contacting the braze joint 106.

Figure 2:
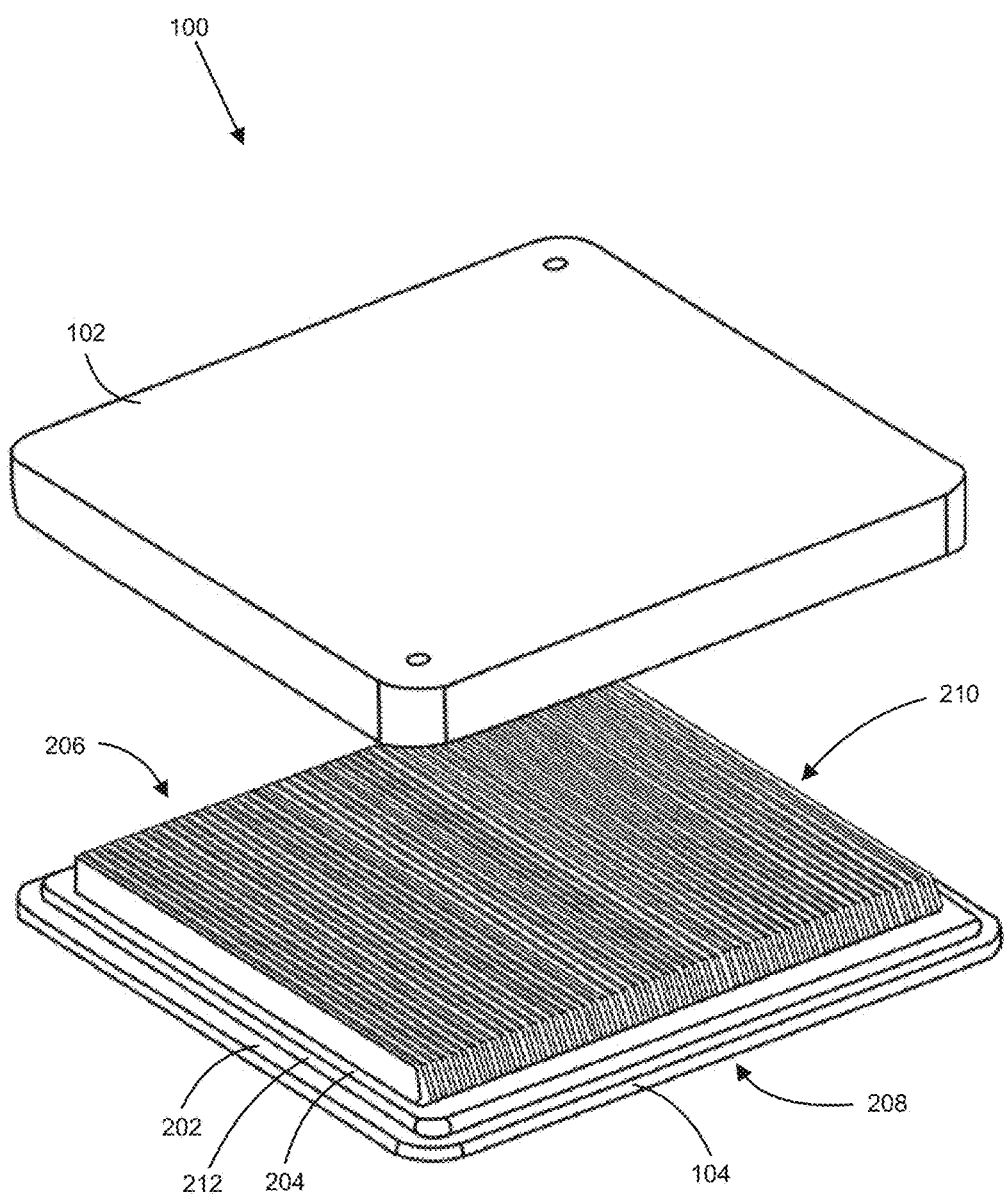
FIG. 2 illustrates the example cold plate of FIG. 1 disassembled, according to various embodiments.

FIG. 2 illustrates the example cold plate 100 of FIG. 1 disassembled, according to various embodiments. The base 104 may include a first side 206, to which the lid 102 is affixed when the cold plate 100 is assembled, and a second side 208 opposite to the first side 206. The base 104 may include a first surface 202 and a second surface 204 on the first side 206 of the base 104 to which the lid 102 is affixed when the cold plate 100 is assembled. The first surface 202 may extend around an outside of the second surface 204, effectively bordering the second surface 204. The first surface 202 and the second surface 204 may be parallel to each other. The second surface 204 may be located further from the second side 208 than the first surface 202 is located from the second side 206. The dam (not visible in FIG. 2, see e.g., 704 of FIG. 7) may be compressed against the second surface 204 when the lid 102 and the base 104 are affixed to each other. In other embodiments, the base 104 may include a single surface on the first side 206. In these embodiments, the dam may be compressed against the single surface when the lid 102 and the base 104 are affixed to each other. Further, in other embodiments, the base 104 may include more than two surfaces.

A transition surface 212 may extend between the first surface 202 and the second surface 204. The transition surface 212 may extend at substantially a 90 degree angle (within 5 degrees) to the first surface 202 and the second surface 204. In other embodiments, the transition surface 212 may extend between the first surface 202 and the second surface 204 at angle between 0 and 90 degrees to the first surface 202. Further, in some embodiments, the transition surface 212 may be curved or a portion of the transition surface 212 may be curved.

The base 104 may further include one or more fins 210, such as heat sink fins, that extend from the second surface 204. The fins 210 may extend substantially perpendicular (within five degrees) from the second surface 204. In some embodiments, the fins 210 may extend at a different angle between 0 degrees and 90 degrees from the second surface 204. The fins 210 may extend into the cavity when the lid 102 is affixed to the base 104 (as is described further throughout this disclosure). The fins 210 may be formed of the same material as the rest of the base 104.

Figure 3:
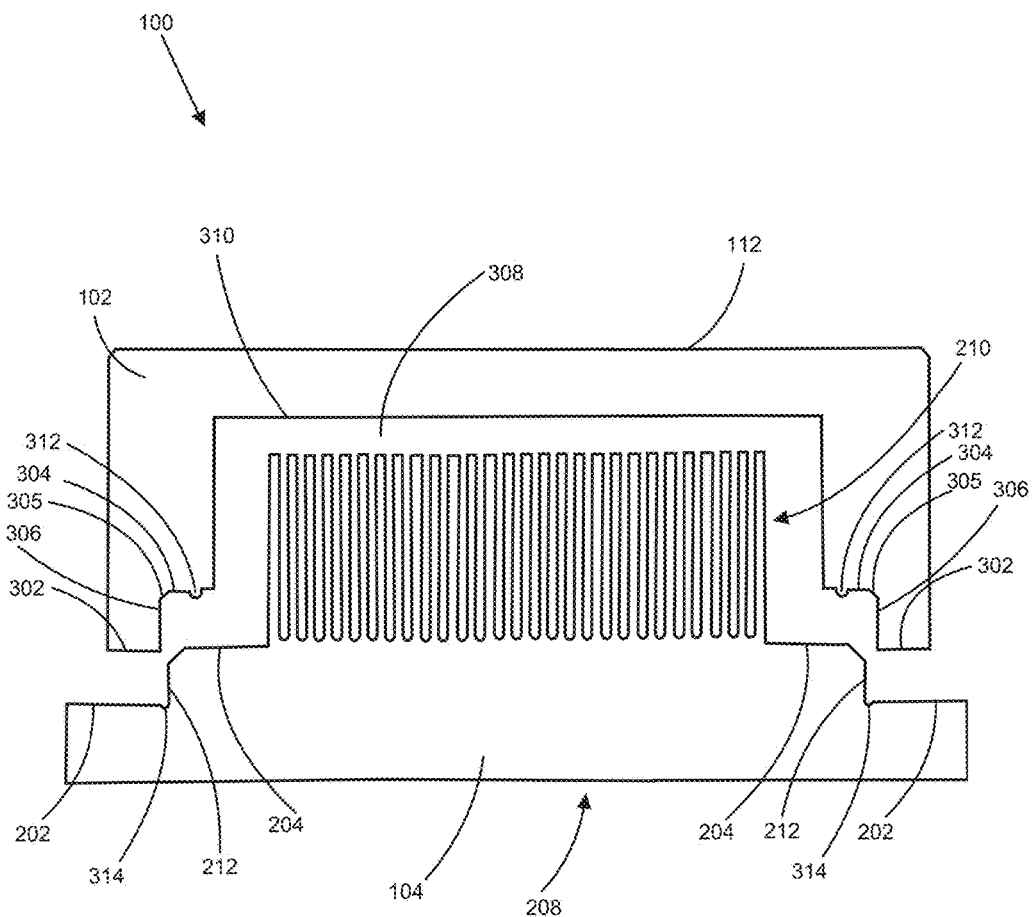
FIG. 3 illustrates a cross-sectional view of the example cold plate of FIG. 1 disassembled, according to various embodiments.

FIG. 3 illustrates a cross-sectional view of the example cold plate 100 of FIG. 1 disassembled, according to various embodiments. The illustrated view of the cold plate 100 is illustrated with the lid 102 aligned with the base 104. When the lid 102 and the base 104 are aligned, the first surface 202 of the base 104 (e.g., the outer, horizontal surface of the base 104 that abuts the edge of the lid 102 when the cold plate 100 is assembled) may be aligned with a first surface 302 of the lid 102 (e.g., the outer, horizontal surface of the lid 102 that abuts the first surface 202 when the cold plate 100 is assembled) and the second surface 204 of the base 104 (e.g., the inner, horizontal surface of the base 104 that is compressed against the seal feature 312 when the cold plate 100 is assembled) may be aligned with a second surface 304 of the lid 102 (e.g. the inner, horizontal surface of the lid 102 from which the seal feature 312 extends). When a force is applied to the lid 102 and/or the base 104 in a direction perpendicular to the top surface 112 of the lid 102 and/or the second side 208 of the base 104 during assembly of the cold plate 100, the first surface 202 may move to abut the first surface 302 and the second surface 204 may move to abut the second surface 304.

Further, when the lid 102 and the base 104 are aligned, the transition surface 212 of the base 104 may be aligned with a transition surface 306 of the lid 102. The transition surface 306 may extend between the first surface 302 and the second surface 304 of the lid 102. The transition surface 306 may be substantially parallel (within 5 degrees) to the transition surface 212 and may correspond in shape to the transition surface 212. When the force is applied to the lid 102 and/or the base 104, the transition surface 212 may move to abut the transition surface 306. In some embodiments, a space may be located between the transition surface 212 and the transition surface 306 after the force is applied, which may provide tolerance in alignment of the lid 102 and the base 104.

The lid 102 may further include a connecting surface 305 that extends between the second surface 304 and the transition surface 306. The connecting surface 305 may be a straight surface that extends between the second surface 304 and the transition surface 306 or may be curved. In some embodiments, the connecting surface 305 may be omitted and the second surface 304 may abut the transition surface 306.

The lid 102 may further include a central surface 310. The central surface 310 may be bordered by the second surface 304 that extends around the central surface 310. The central surface 310 may be recessed from the second surface 304 to form a recess 308. Further, when the lid 102 and the base 104 are aligned, the fins 210 may be aligned with the recess 308 and/or may extend within the recess 308 toward the central surface 310.

The lid 102 may further include a seal feature 312 that extends from the second surface 304 of the lid 102. The seal feature 312 may extend substantially perpendicular (within 5 degrees) from the second surface 204 and may narrow as the seal feature 312 extends further from the second surface 204. The seal feature 312 may extend around a circumference of the recess 308 and may form a perimeter around the recess 308. A size of the seal feature 312 may be selected and/or designed based on a size of the lid, a pressure of which liquid coolant is to be circulated through a cavity (as is described further throughout this disclosure), or some combination thereof.

A distance that the seal feature 312 extends from the second surface 304 may be dependent on the positions of the first surface 202, the first surface 302, the second surface 204, and/or the second surface 304. In particular, a first distance may exist between the first surface 202 and the second surface 204 and a second distance may exist between the first surface 302 and the second surface 304. The first distance may be greater than the second distance, where the seal feature 312 may extend from the second surface 302 by a distance greater than the difference between the first distance and the second distance.

When lid 102 and the base 104 are aligned, the seal feature 312 may be aligned with a portion of the second surface 204 and may extend from the second surface 304 toward the second surface 204. The portion of the second surface 204 may have a roughness of less than 63 micro inches and/or a flatness of less than 0.002 inches. When the force is applied to the lid 102 and/or the base 104, the seal feature 312 may be compressed against the second surface 204 and may form the dam (see e.g., 704 of FIG. 7).

The base 104 may include a braze material relief recess 314 formed between the first surface 202 (e.g., the outer, horizontal surface of the base 104 that abuts the edge of the lid 102 when the cold plate 100 is assembled) and the transition surface 212. The braze material relief recess 314 may recess into the base 104 from the first surface 202. The braze material relief recess 314 may provide an area for excess braze material to settle (as will be described later throughout the disclosure) to prevent excessive wicking of the braze material. The braze material relief recess 314 may extend around a circumference of the transition surface 212 along the first surface 202.

Figure 4:
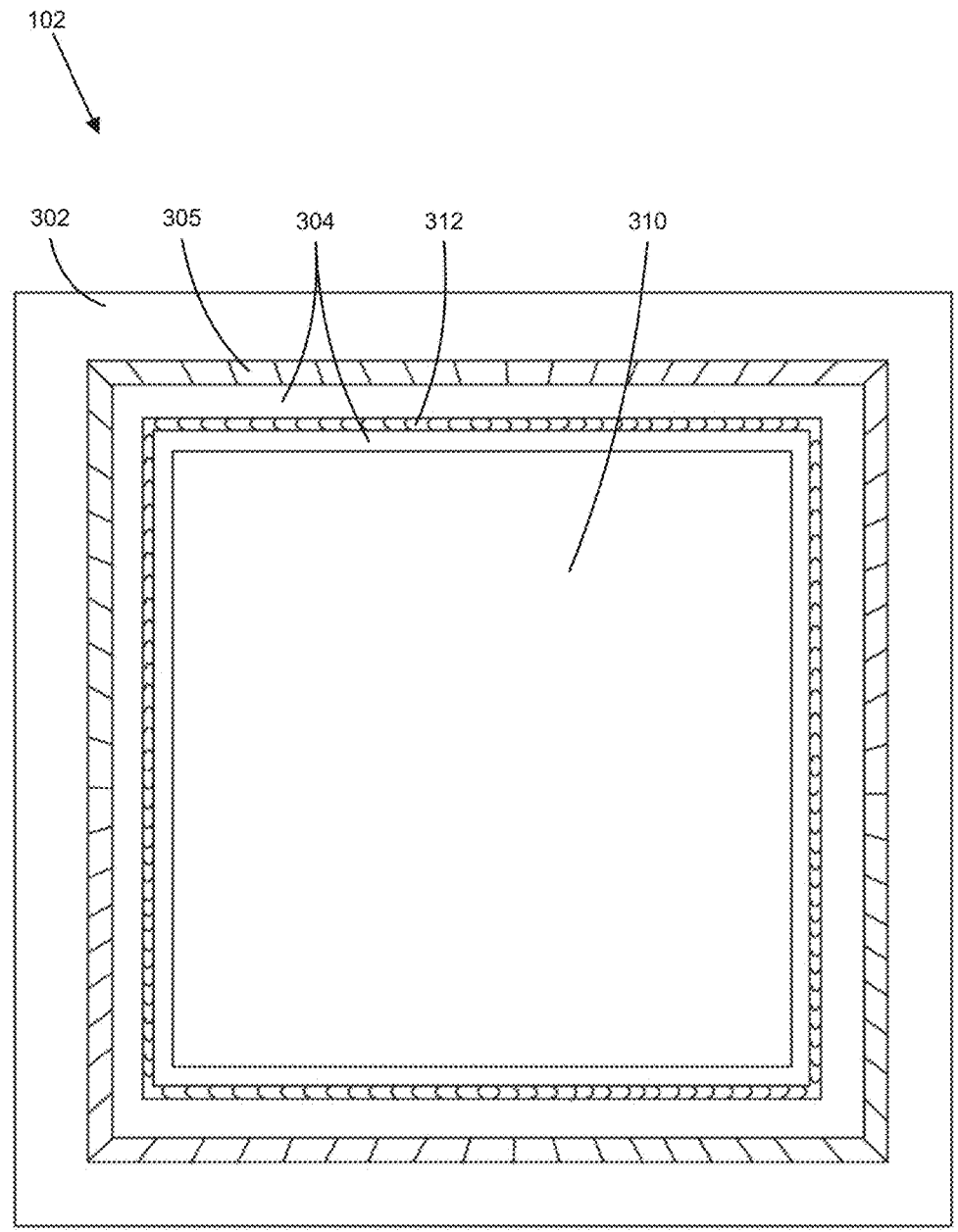
FIG. 4 illustrates an inside view of the lid of the example cold plate of FIG. 1, according to various embodiments.

FIG. 4 illustrates an inside view of the lid 102 of the example cold plate 100 of FIG. 1, according to various embodiments. The inside view illustrates the lid 102 viewed from the side of the lid 102 that ends up being affixed to the base 104 (FIG. 1).

The lid 102 may include the first surface 302 (e.g., the outer, horizontal surface of the lid 102 that abuts the first surface 202 of the base 104 (FIG. 1) when the cold plate 100 is assembled). The first surface 302 may extend around a perimeter of the lid 102. The braze joint 106 (FIG. 1) may be formed along the first surface 302 when the lid 102 is affixed to the base 104.

The lid 102 may further include the connecting surface 305 that extends between the transition surface 306 (FIG. 3) and the second surface 304 (FIG. 3, e.g. the inner, horizontal surface of the lid 102 from which the seal feature 312 extends). In the illustrated view, the connecting surface 305 may be set back from the first surface 302, with the transition surface 306 extending from the first surface 302 to the connecting surface 305. The connecting surface 305 may extend around the lid 102 at a distance from the perimeter of the lid 102, such that the connecting surface 305 is the distance from the perimeter of the lid 102 for the entirety of the lid 102. In some embodiments, the connecting surface 305 may be omitted and the transition surface 306 may abut the second surface 304. Further, in some embodiments, the distance from the connecting surface 305 to the perimeter of the lid 102 may vary between the edges of the lid 102.

The lid 102 may further include the second surface 304. The second surface 304 may extend from the connecting surface 305 to the perimeter of the recess 308 (FIG. 3). The second surface 304 may extend around the lid 102 at a distance from the perimeter of the lid 102, such that the second surface 304 is the distance from the perimeter of the lid 102 for the entirety of the lid 102. The distance from the second surface 304 to the perimeter of the lid 102 may be greater than the distance from the connecting surface 305 to the perimeter of the lid 102. In some embodiments, the distance from the second surface 304 to the perimeter of the lid 102 may vary between the edges of the lid 102.

The lid 102 may further include the seal feature 312 that extends from the second surface 304. The seal feature 312 may extend around the lid 102 at a distance from the perimeter of the lid 102, such that the seal feature 312 is the distance from the perimeter of the lid 102 for the entirety of the lid 102. The distance from the seal feature 312 to the perimeter of the lid 102 may be greater than the distance from the outer edge of the second surface 304 to the perimeter of the lid 102. In some embodiments, the distance from the seal feature 312 to the perimeter of the lid 102 may vary between the edges of the lid 102. When the force is applied to the lid 102 and/or the base 104, the seal feature 312 may be compressed against the base 104 (FIG. 1) and may form the dam (see e.g., 704 of FIG. 7). The dam may be formed around the lid 102 at the distance from the perimeter of the lid 102 (being the distance of the seal feature 312 from the perimeter of the lid 102), wherein the dam is compressed against the base 104 for the entirety of the perimeter.

The lid may further include the central surface 310 that extends along the second surface 304. The central surface 310 may abut the recess 308 and may be set back from the second surface 304 in the illustrated view.

Figure 5:
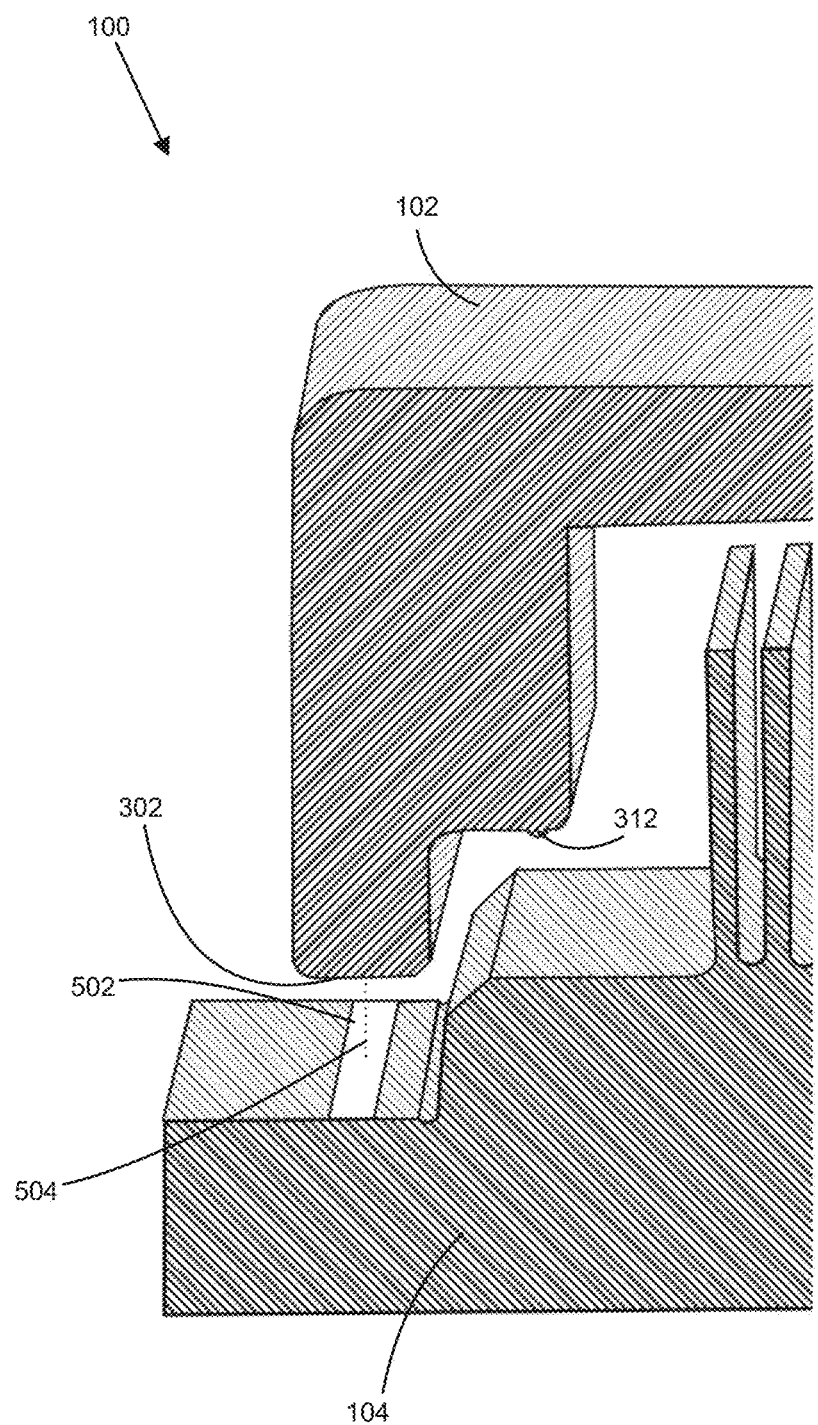
FIG. 5 illustrates a close-up cross-sectional view of a portion of the example cold plate of FIG. 1 disassembled, according to various embodiments.

FIG. 5 illustrates a close-up cross-sectional view of a portion of the example cold plate 100 of FIG. 1 disassembled, according to various embodiments. In particular, FIG. 5 illustrates a side of the lid 102 aligned with a side of the base 104. The lid 102 and the base 104 may be aligned as described in relation to FIG. 3.

The base 104 may include a braze portion 502, where the braze joint 106 (FIG. 1) may be formed when the lid 102 is affixed to the base 104. The braze portion 502 may be aligned with the first surface 302 of the lid 102 (e.g., the outer, horizontal surface of the lid 102 that abuts the first surface 202 of the base 104 (FIG. 1) when the cold plate 100 is assembled), wherein the first surface 302 may abut the braze portion 502 after the force is applied to the lid 102 and/or the base 104 and the lid 102 is moved to abut the base 104. In some embodiments, the braze portion 502 may be aligned with the first surface 302 along a compression reference line 504 (illustrated as a dotted line), wherein the first surface 302 and/or the braze portion 502 move toward each other along the compression reference line 504 until the first surface 302 abuts the braze portion 502 in response to the application of the force to the lid 102 and/or the base 104. The braze joint 106 may be formed between the braze portion 502 and the first surface 302. The seal feature 312 may be located toward the interior of the lid 102 from the first surface 302, where the braze joint 106 may be formed. As the force is applied to the lid 102 and/or the base 104 and the braze joint 106 is formed, the seal feature 312 may be compressed against the base 104 and may form the dam (see e.g., 704 of FIG. 7).

In some embodiments, a brazing material may be applied to a braze portion 502 prior to the lid 102 and the base 104 being moved to abut each other. In these embodiments, the force may be applied to the lid 102 and/or the base 104 causing the lid 102 to abut the base 104 with the brazing material located between the lid 102 and the base 104. Heat may be applied to the lid 102, the base 104, the braze material, or some combination thereof, which may cause the braze material to melt. The heat may be removed and the braze material may solidify affixing the lid 102 to the base 104. The heat may be applied to the lid 102, the base 104, the braze material, or some combination thereof, when the force is being applied to the lid 102 and/or the surface 104, or after the force has been removed.

Figure 6:
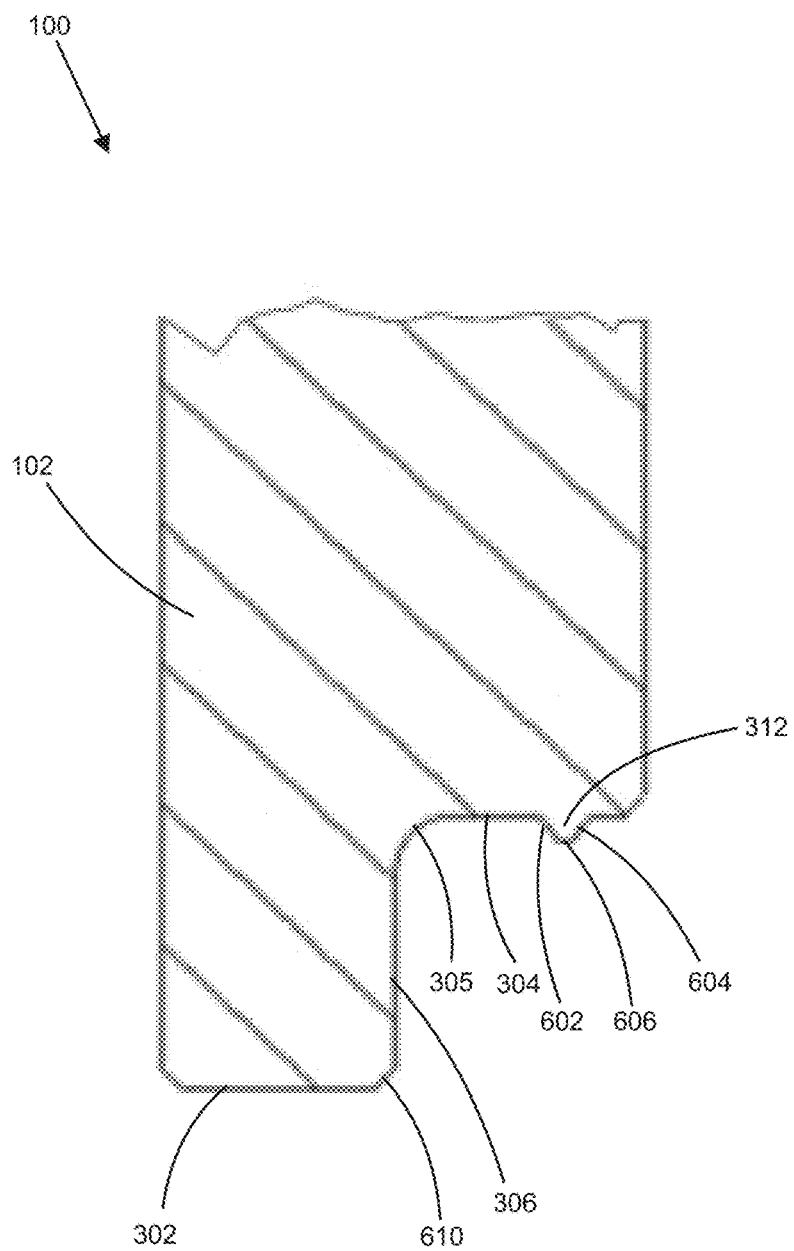
FIG. 6 illustrates a close-up cross-sectional view of the seal feature of the example cold plate of FIG. 1 disassembled, according to various embodiments.

FIG. 6 illustrates a close-up cross-sectional view of the seal feature 312 of the example cold plate 100 of FIG. 1, according to various embodiments. The seal feature 312 may extend from the second surface 304 of the lid 102 (e.g. the inner, horizontal surface of the lid 102) substantially perpendicular (within 5 degrees) to the second surface 304. The seal feature 312 may narrow as the seal feature 312 extends away from the second surface 304. In the illustrated embodiment, the seal feature 312 may include a first side 602 and a second side 604 that are straight and extend toward each other to a flat portion formed at a tip 606 of the seal feature 312. In other embodiments, the seal feature 312 may be different shapes, including the first side 602 and the second side 604 being curved, the tip 606 being curved, the entire seal feature 312 being curved, or some combination thereof. As the force is applied to the lid 102 and/or the base 104 (FIG. 1), the seal feature 312 may be compressed against the base 104 and may form the dam (see e.g., 704 of FIG. 7).

The lid 102 may further include a connecting surface 305 located between the second surface 304 and the transition surface 306. The connecting surface 305 may form a second braze material relief recess when the lid 102 is affixed to the base 104 (FIG. 1). In other embodiments, the connecting surface 305 may be a straight surface extending from the second surface 304 to the transition surface 306. Further, in other embodiments, the connecting surface 305 may be omitted and the second surface 304 may abut the transition surface 306.

The lid 102 may further include an intermediate surface 610 located between the transition surface 306 and the first surface 302 (e.g., the outer, horizontal surface of the lid 102 that abuts the first surface 202 of the base 104 (FIG. 1) when the cold plate 100 is assembled). The intermediate surface 610 may be a flat surface that extends between the transition surface 306 and the first surface 302. When the lid 102 is affixed to the base 104, the intermediate surface may align with the braze material relief recess 314 (FIG. 3) and may increase the area into which the excess braze material may settle to prevent excessive wicking of the braze material. In other embodiments, the intermediate surface 610 may be curved. Further, in some embodiments, the intermediate surface 610 may be omitted and the transition surface 306 may abut the first surface 302.

Figure 7:
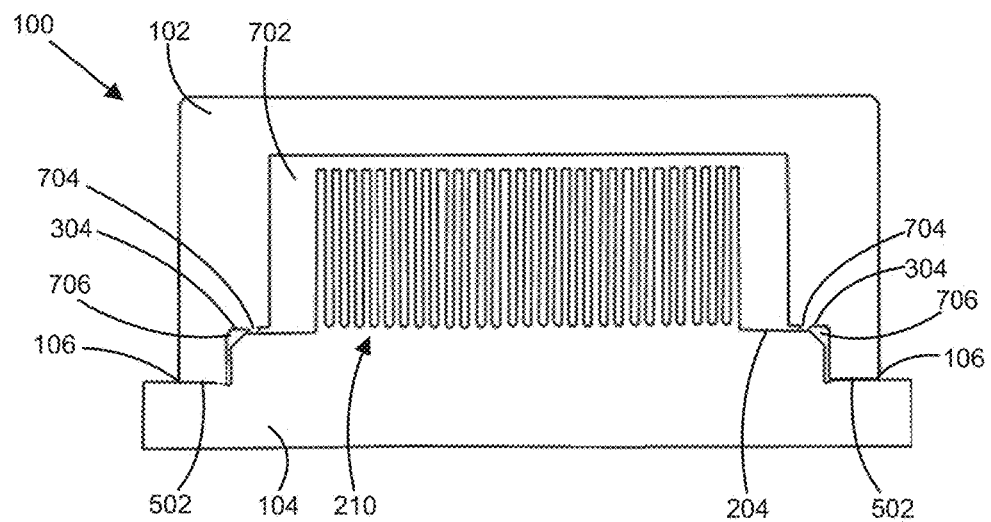
FIG. 7 illustrates a cross-sectional view of the example assembled cold plate of FIG. 1, according to various embodiments.

FIG. 7 illustrates a cross-sectional view of the example assembled cold plate 100 of FIG. 1, according to various embodiments. In the illustrated embodiment, the lid 102 may be affixed to the base 104 via the braze joint 106, which may be formed at the brazing portion 502.

A cavity 702 may be formed between the lid 102 and the base 104 when the lid is affixed to the base 104. The cavity 702 may be formed by the recess 308 (FIG. 3) of the lid 102 being enclosed between the lid 102 and the base 104 when the lid 102 is affixed to the base 104. The cavity 702 may provide a circulation passage for a liquid coolant circulated within the cold plate 100. The fins 210 of the base 104 may extend into the cavity 702 and the liquid coolant circulated within the cold plate 100 may pass through the fins 210 cooling the fins 210. In some embodiments, the cavity 702 may provide a circulation passage for a vapor coolant circulated within the cold plate 100, where the vapor coolant may pass through the fins 210.

Figure 8:
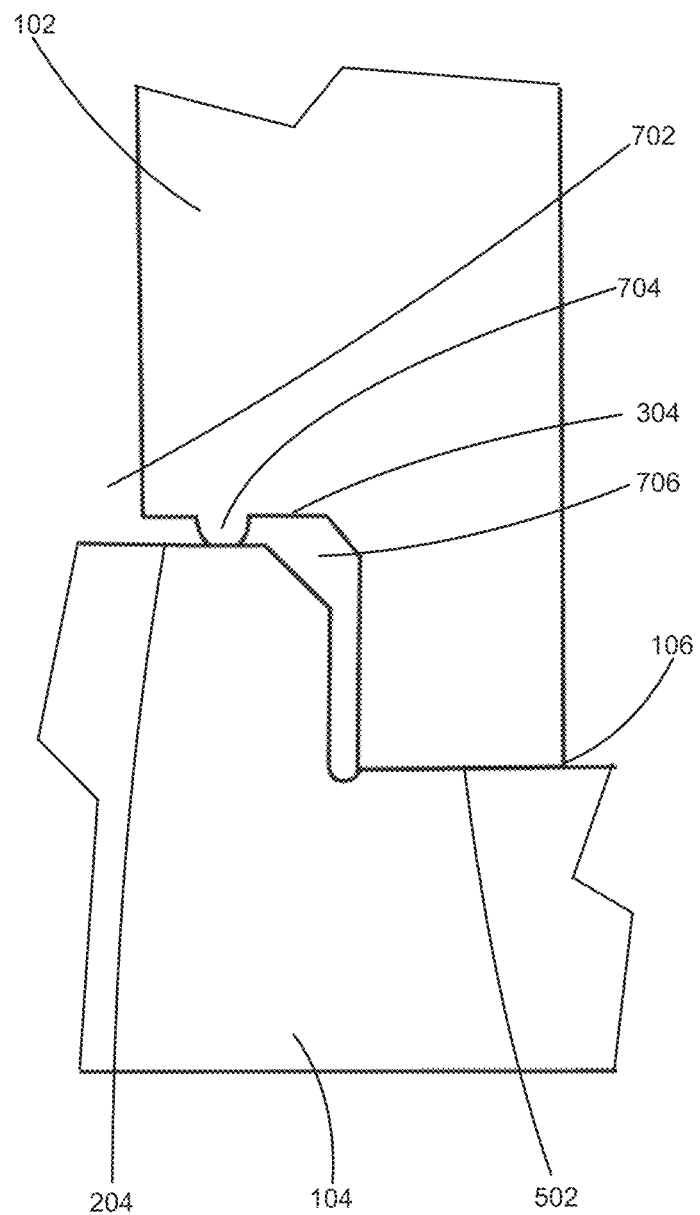
FIG. 8 illustrates a close-up, cross sectional view of an example dam of the assembled cold plate of FIG. 7.

The cold plate 100 may include a dam 704 formed between the second surface 304 of the lid 102 (e.g. the inner, horizontal surface of the lid 102 from which the seal feature 312 extends) and the second surface 204 of the base 104 (e.g., the inner, horizontal surface of the base 104 that is compressed against the seal feature 312 when the cold plate 100 is assembled). The dam 704 may be formed by the seal feature 312 being compressed and/or crushed between the second surface 304 and the second surface 204 when the force is being applied to the lid 102 and/or the base 104. The seal feature 312 may deform to the second surface 204 when the force is being applied to the lid 102 and/or the base 104, the deformed seal feature 312 being the dam 704. FIG. 8 illustrates a close-up, cross sectional view of the example dam 704 of the assembled cold plate 100 of FIG. 7.

The dam 704 may be liquid-tight against the second surface 204 of the base 104. The braze joint 106 may maintain, or substantially maintain (within 10 pounds-force or approximately 44.5 newtons), a pressure and/or force at which the dam 704 is compressed against the second surface 204 when the lid 102 is affixed to the base 104. The dam 704 may maintain the liquid coolant and/or the vapor coolant within the cavity 702, preventing the liquid coolant and/or the vapor coolant from contacting the braze joint 106 (FIG. 1). The pressure and/or force at which the dam 704 is compressed against the second surface 204 may exceed a pressure at which the liquid coolant and/or the vapor coolant is circulated through the cavity 702. For example, if the liquid coolant and/or vapor coolant is pressurized to 100 pounds-force per square inch (approximately 689 kilopascals), the dam 704 may be compressed against the second surface 204 at a pressure and/or force greater than 100 pounds-force per square inch.

A second cavity 706 may be formed from the dam 704 to the braze joint 106 between the lid 102 and the base 104. The second cavity 706 may abut the braze material relief recess 314 (FIG. 3), the connecting surface 305 (FIG. 6), the intermediate surface 610 (FIG. 6), or some combination and may provide an area into which the excess braze material may settle to prevent excessive wicking of the braze material. In particular, the braze material may partially fill the second cavity 706 between the brazing portion 502 and the dam 704.

Figure 9:
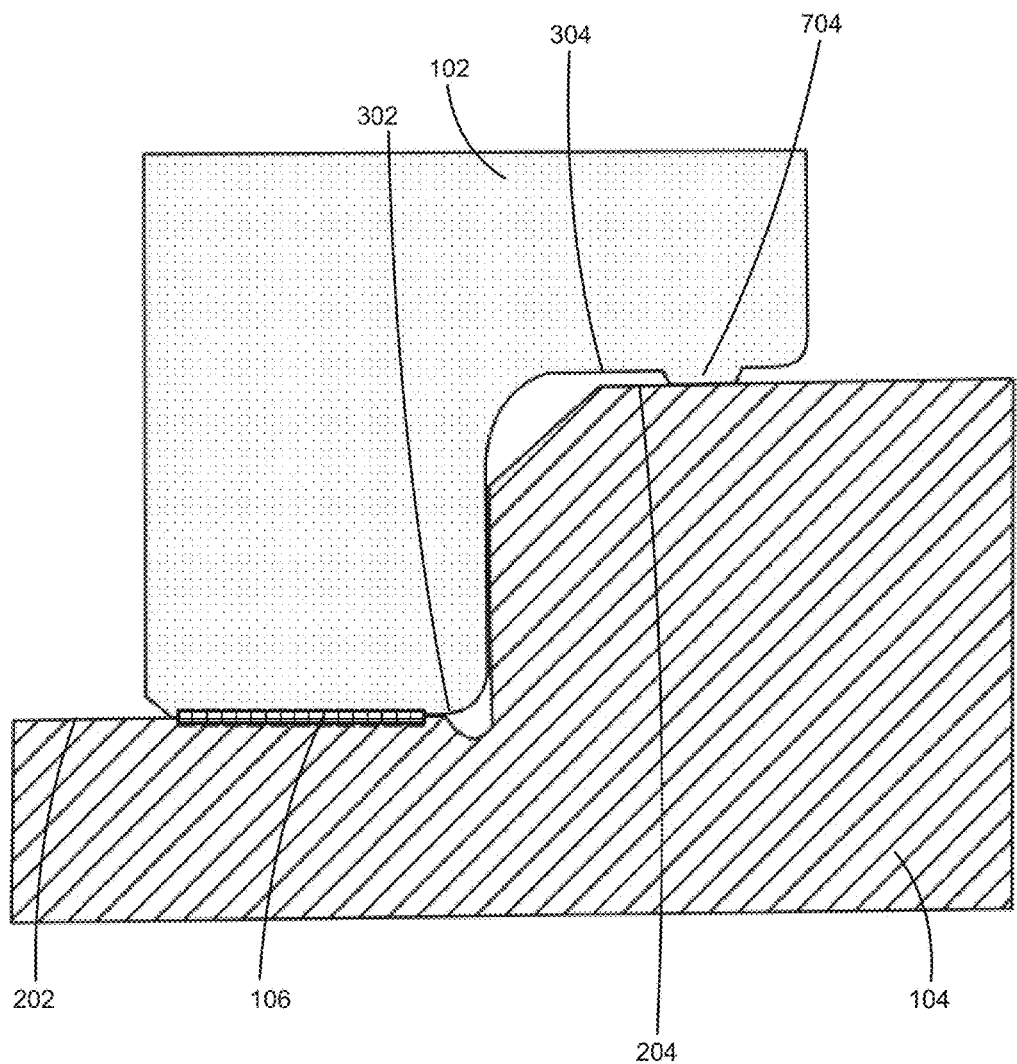
FIG. 9 illustrates an example dam of the assembled cold plate of FIG. 1, according to various embodiments.

FIG. 9 illustrates an example dam 704 of the assembled cold plate of FIG. 1, according to various embodiments. The dam 704 may extend from the second surface 304 of the lid 102 and contact the second surface 204 of the base 104 (e.g., the inner, horizontal surface of the base 104 that is compressed against the seal feature 312 of the lid 102 when the cold plate 100 is assembled). The dam 704 may be deformed to the second surface 204, as illustrated by the dam 704 being flattened against the second surface 204 in FIG. 9.

The braze joint 106 may be formed between the first surface 302 of the lid 102 (e.g., the outer, horizontal surface of the lid 102 that abuts the first surface 202 of the base 104 (FIG. 1) when the cold plate 100 is assembled) and the first surface 202 of the base 104 (e.g., the outer, horizontal surface of the base 104 that abuts the edge of the lid 102 when the cold plate 100 is assembled), and may affix the first surface 302 to the first surface 202. The braze joint 106 may maintain the position of the lid 102 relative to the base 104. The braze joint 106 may also maintain the pressure at which the dam 704 is compressed against the second surface 204 at a same pressure, or substantially same pressure (within 10 pounds-force or approximately 44.5 newtons), as the pressure at which the dam 704 was compressed against the second surface 204 while the force was being applied to the lid 102 and/or the base 104.

Figure 10:
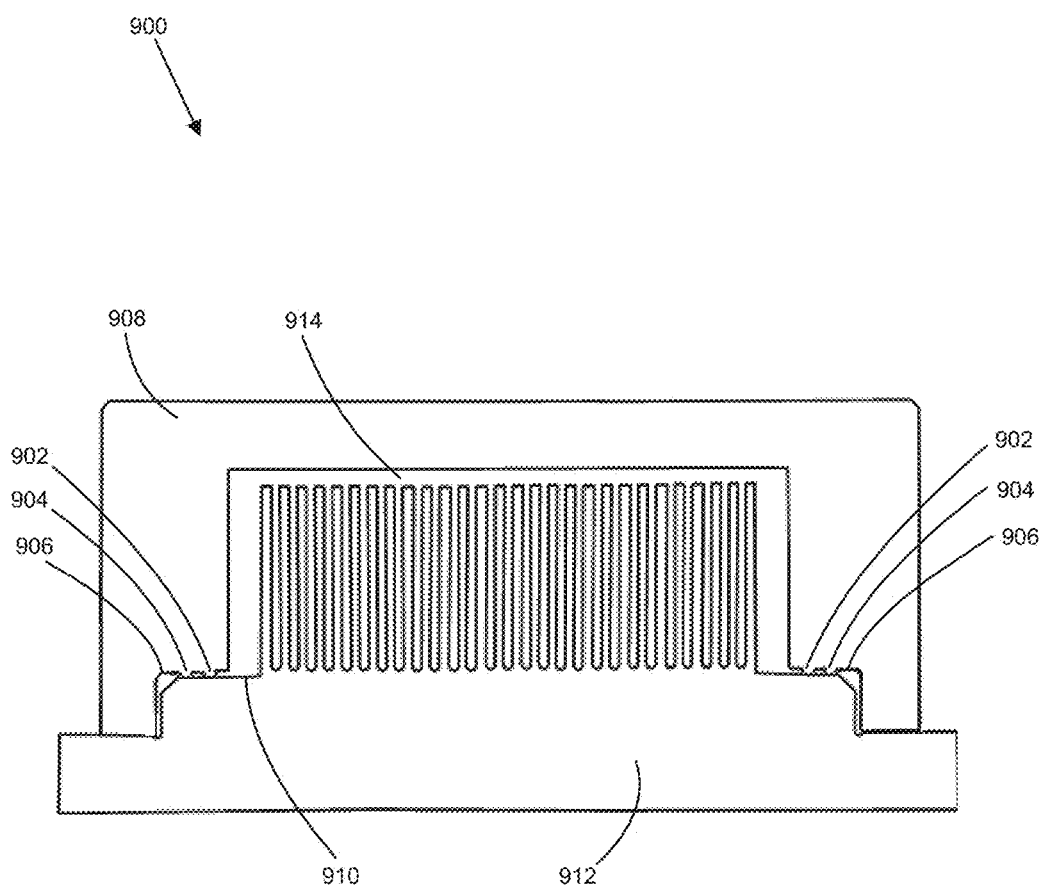
FIG. 10 illustrates a cross-sectional view of another example assembly cold plate, according to various embodiments.

FIG. 10 illustrates a cross-sectional view of another example assembly cold plate 900, according to various embodiments. The cold plate 900 may include one or more of the features of the cold plate 100 (FIG. 1).

The cold plate 900 may include a first dam 902 and a second dam 904 that extend from a surface 906 of a lid 908 of the cold plate 900. The first dam 902 and the second dam 904 may include one or more features of the dam 704 (FIG. 7). The second dam 904 may be located between the first dam 902 and a perimeter of the lid 908. The first dam 902 and the second dam 904 may be compressed against a surface 910 of a base 912 of the cold plate 900. Both the first dam 902 and the second dam 904 may be compressed against the surface 910 at a pressure that is greater than a pressure at which a liquid coolant and/or vapor coolant is circulated through a cavity 914 of the cold plate 900.

The first dam 902 may be formed from a first seal feature and the second dam 904 may be formed from a second seal feature. The first seal feature and the second seal feature may include one or more of the features of the seal feature 312 (FIG. 3). The first dam 902 and the second dam 904 may be formed by applying a force to the lid 908 and/or the base 912 that causes the first seal feature and the second seal feature to be compressed against the surface 910 and deform to the surface 910.

While the cold plate 900 is illustrated with two dams, the first dam 902 and the second dam 904, it is to be understood that the cold plate 900 may include more than two dams in other embodiments. Further, it is to be understood that, with the exception of the two dams, the cold plate 900 may include all the same features as the cold plate 100 (FIG. 1) in some embodiments.

Figure 11:
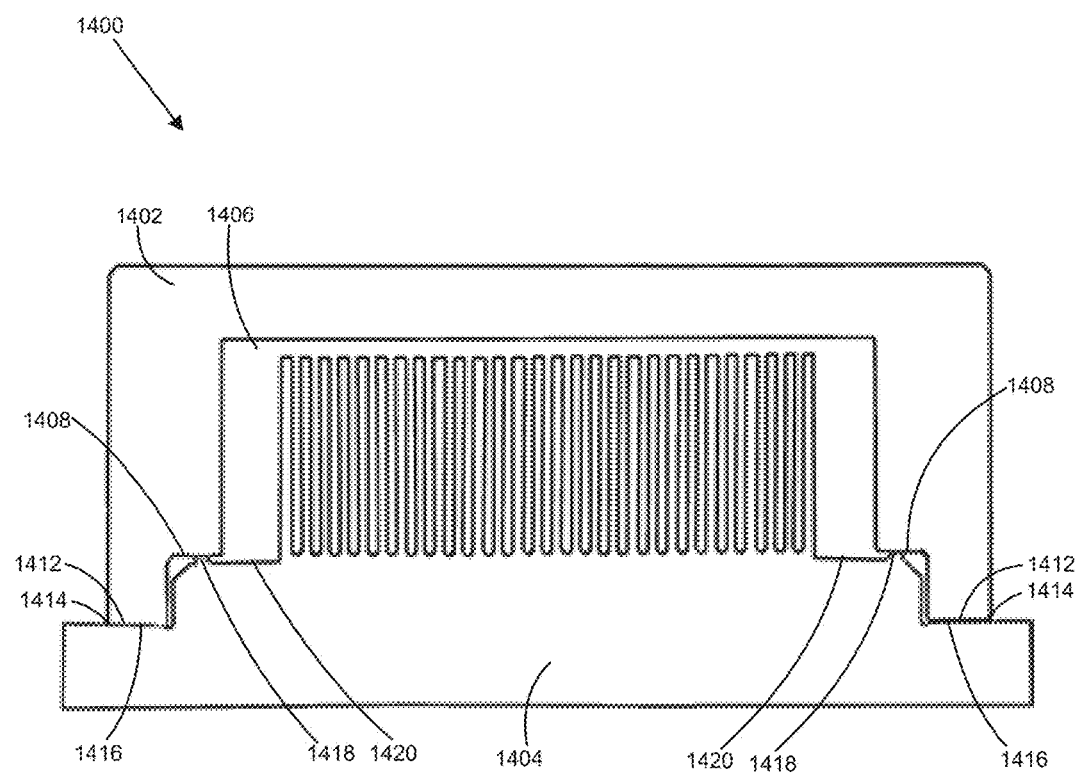
FIG. 11 illustrates a cross-sectional view of another example assembled cold plate, according to various embodiments.

FIG. 11 illustrates a cross-sectional view of another example assembled cold plate 1400, according to various embodiments. The cold plate 1400 may include one or more of the features of the cold plate 100 (FIG. 1).

The cold plate 1400 may include a lid 1402 and a base 1404. The lid 1402 may include one or more of the features of the lid 102 (FIG. 1) and the base 1404 may include one or more features of the base 104 (FIG. 1). The lid 1402 and the base 1404 may be formed of the same material.

The lid 1402 may be affixed to the base 1404 via the braze joint 1414. The braze joint 1414 may include a brazing material that is different from the material that forms the lid 1402 and the base 1404. The braze joint may be formed between a first surface 1416 of the base 1404 (e.g., the outer, horizontal surface of the base 1404 that abuts the edge of the lid 1402 when the cold plate 1400 is assembled) and a first surface 1412 of the lid 1402 (e.g., the outer, horizontal surface of the lid 1402 that abuts the first surface 1416 when the cold plate 1400 is assembled).

A cavity 1406 may be formed between the lid 1402 and the base 1404 when the lid 1402 is affixed to the base 1404. The cavity 1406 may include one or more of the features of the cavity 702 (FIG. 7). The cavity 1406 may be enclosed between the lid 1402 and the base 1404 when the lid 1402 is affixed to the base 1404. The cavity 1406 may provide a circulation passage for a liquid coolant circulated within the cold plate 1400. In some embodiments, the cavity 1406 may provide a circulation passage for a vapor coolant circulated within the cold plate 1400.

The cold plate 1400 may include a dam 1418 formed between a second surface 1408 of the lid 1402 (e.g. the inner, horizontal surface of the lid 1402 to which the dam 1418 is compressed and a second surface 1420 of the base 1404 (e.g., the inner, horizontal surface of the base 1404 from which the dam 1418 extends). The dam 1418 may include one or more of the features of the dam 704 (FIG. 7). The dam 1418 may be formed by a seal feature (such as the seal feature 312 (FIG. 3)) that extends from the base 1404 being compressed and/or crushed between the second surface 1408 and the second surface 1420 when a force is being applied to the lid 1402 and/or the base 1404. The seal feature may deform to the second surface 1408 when the force is being applied to the lid 1402 and/or the base 1404, the deformed seal feature being the dam 1418.

The dam 1418 may be liquid-tight against the second surface 1408 of the lid 1402. The braze joint 1414 may maintain, or substantially maintain (within 10 pounds-force or approximately 44.5 newtons), a pressure and/or force at which the dam 1418 is compressed against the second surface 1408 when the lid 1402 is affixed to the base 1404. The dam 1418 may maintain the liquid coolant and/or the vapor coolant within the cavity 1406, preventing the liquid coolant and/or the vapor coolant from contacting the braze joint 1414. The pressure and/or force at which the dam 1418 is compressed against the second surface 1408 may exceed a pressure at which the liquid coolant and/or the vapor coolant is circulated through the cavity 1406. For example, if the liquid coolant and/or vapor coolant is pressurized to 100 pounds-force per square inch (approximately 689 kilopascals), the dam 1418 may be compressed against the second surface 1408 at a pressure and/or force greater than 100 pounds-force per square inch.

Figure 12:
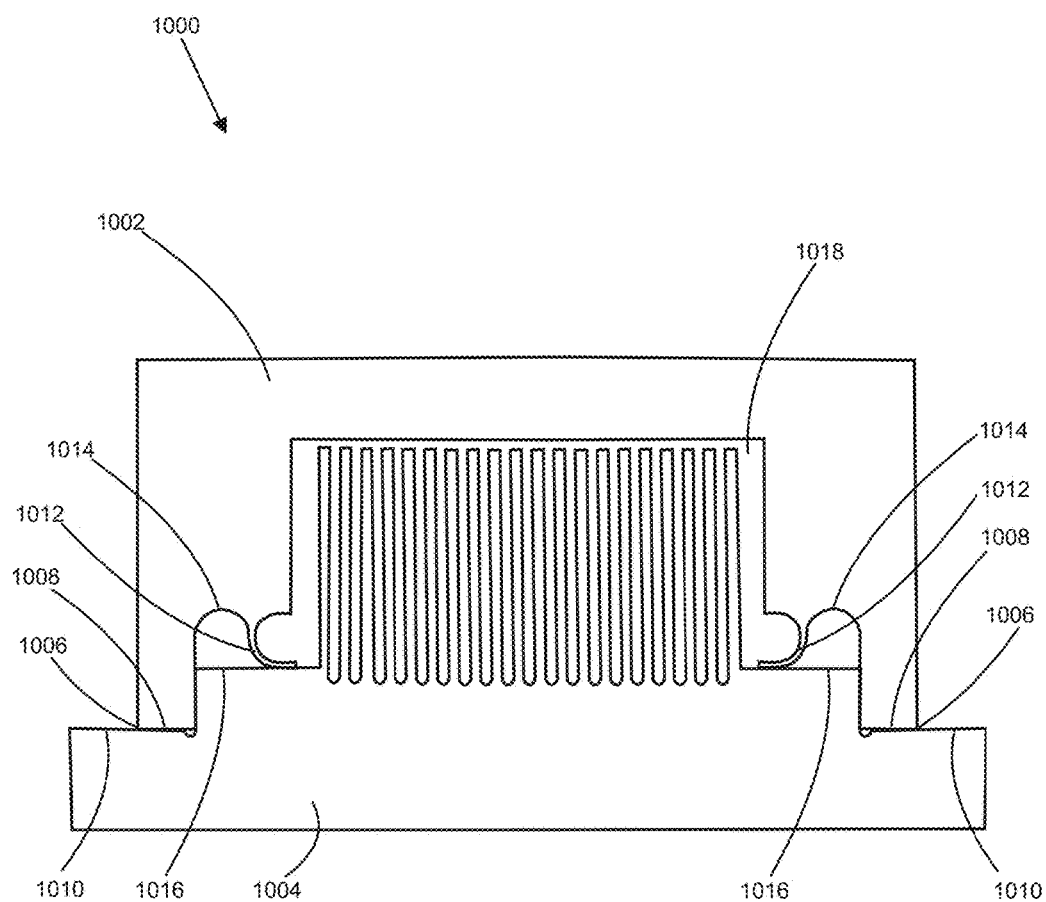
FIG. 12 illustrates a cross-sectional view of another example assembled cold plate, according to various embodiments.

FIG. 12 illustrates a cross-sectional view of another example assembled cold plate 1000, according to various embodiments. The cold plate 1000 may include one or more of the features of the cold plate 100 (FIG. 1) and/or the cold plate 1400 (FIG. 11). The cold plate 1000 may include a lid 1002 and a base 1004. The lid 1002 may include one or more of the features of the lid 102 (FIG. 1), and the base 1004 may include one or more of the features of the base 104 (FIG. 1).

The lid 1002 may be affixed to the base 1004 via a braze joint 1006. The braze joint 1006 may be formed between a first surface 1008 of the lid 1002 and a first surface 1010 of the base 1004 and may affix the first surface 1008 to the first surface 1010.

The lid 1002 may include a dam 1012 that extends from a second surface 1014 of the lid 1002. The dam 1012 may contact a second surface 1016 of the base 1004 and may be deformed to the second surface 1016. The dam 1012 may be formed by compressing a seal feature that is resilient against the second surface 1016. The seal feature may be compressed against the second surface 1016 by applying a force to the lid 1002 and/or the base 1004 that causes the seal feature to be compressed against second surface 1016 and forms the dam 1012.

The seal feature may be deformed from an original shape in response to the seal feature being compressed against the second surface 1016 and may spring back to the original shape in response to the seal feature being decompressed from against second surface 1016. In the embodiment illustrated in FIG. 12, the seal feature may be a curved extension extending from the second surface 1014, however, it is to be understood that the seal feature may be any resilient feature or shape. Having the seal feature that is resilient may be beneficial in applications where the lid 1002 and the base 1004 may be separated after initial affixation and reaffixed after being separated.

The dam 1012 may be compressed against the second surface 1016 at a pressure greater that a pressure at which a liquid coolant and/or vapor coolant is circulated through a cavity 1018 of the cold plate 1000. The braze point 1006 may maintain a position of the lid 1002 relative to the base 1004, which in turn may maintain the pressure at which the dam 1012 is compressed against the second surface 1016. The braze point 1006 may maintain the pressure at which the dam 1012 is compressed against to second surface 1016 at a same pressure, or substantially same pressure (within 10 pounds-force or approximately 44.5 newtons), as the pressure at which the dam 1012 was compressed against the second surface 1016 while the force was being applied to the lid 1002 and/or the base 1004.

In other embodiments, the base 1004 may include a dam 1012 that extends from the second surface 1016 of the base 1004. The dam 1012 may contact the second surface 1014 of the lid 1002 and may be deformed to the second surface 1014. The dam 1012 may be formed by compressing a seal feature that is resilient against the second surface 1014. The seal feature may be compressed against the second surface 1014 by applying a force to the lid 1002 and/or the base 1004 that causes the seal feature to be compressed against second surface 1014 and forms the dam 1012.

Further, in other embodiments, the dam 1012 may extend from the second surface 1016 of the base 1004. The dam 1012 may contact the second surface 1014 of the lid 1002 and may be deformed to the second surface 1014. The dam 1012 may be formed by compressing a seal feature that is resilient against the second surface 1014. The seal feature may be compressed against the second surface 1014 by applying a force to the lid 1002 and/or the base 1004 that causes the seal feature to be compressed against second surface 1014 and forms the dam 1012.

Figure 13:
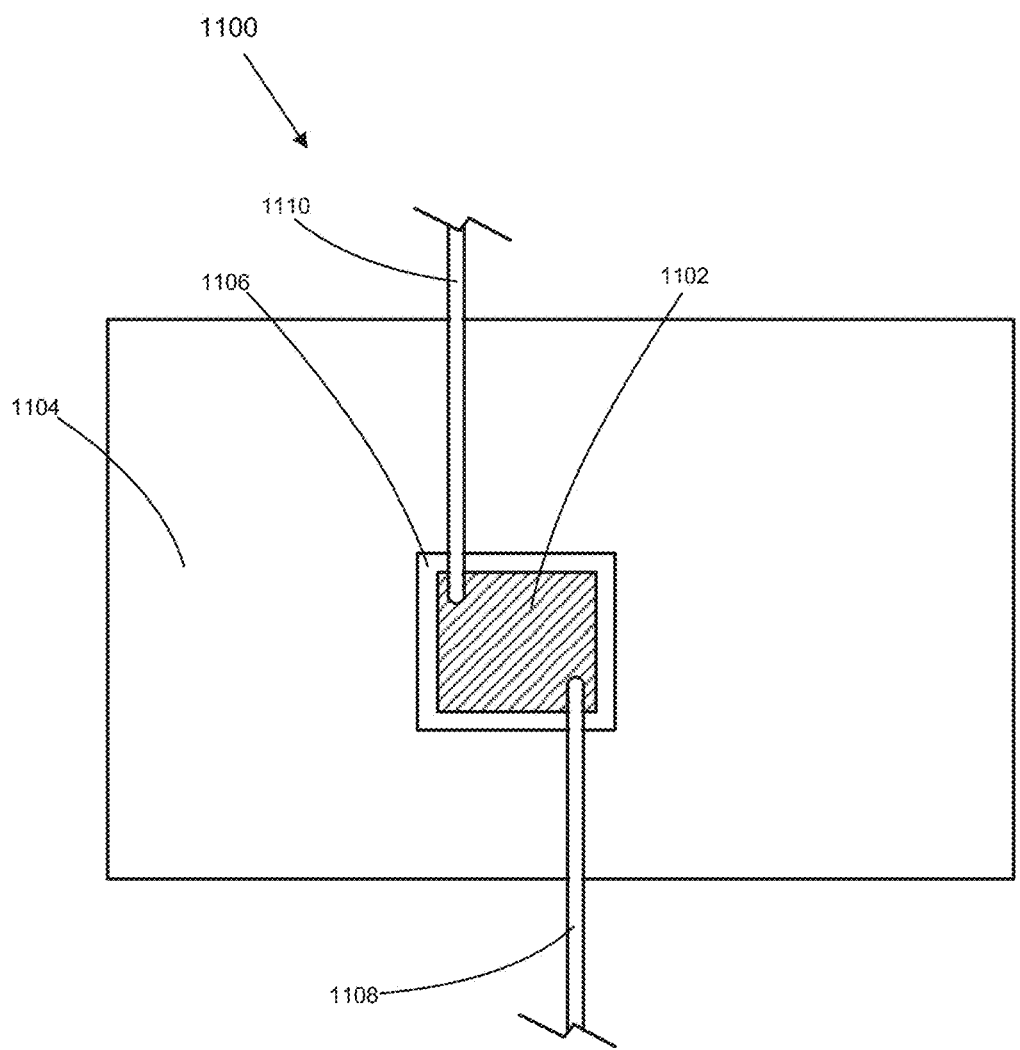
FIG. 13 illustrates an example system that incorporates a cold plate, according to various embodiments.

FIG. 13 illustrates an example electrical system 1100 that incorporates a cold plate 1102, according to various embodiments. The cold plate 1102 may include one or more of the features of the cold plate 100 (FIG. 1), the cold plate 900 (FIG. 10), cold plate 1400 (FIG. 11), and/or the cold plate 1000 (FIG. 12), in particular, the dam feature of the described cold plates. The electrical system 1100 may include a mounting element 1104 with one or more components 1106 mounted to the mounting element 1104. The mounting element 1104 may be a circuit board and the components 1106 may be electrical elements, including, but not limited to, resistors, capacitors, transformers, processors, transistors, integrated circuits, or some combination thereof. The components 1106 may generate heat during operation and/or when power is applied to the components 1106.

The electrical system 1100 may further include a coolant system, where a first coolant tube 1108 and a second coolant tube 1110 of the coolant system are illustrated. The coolant system may include a liquid coolant system, a vapor coolant system, or some combination thereof. The coolant system may cause liquid coolant and/or vapor coolant to be circulated through the first coolant tube 1108, the second coolant tube 1110, and a cavity of the cold plate 1102 (such as the cavity 702 (FIG. 7), the cavity 914 (FIG. 10), and/or the cavity 1018 (FIG. 12)), the liquid and/or vapor to carry heat from cold plate 1102 to a heat exchanger, fan, air conditioner, or other coolant element that dissipates the heat. The dam feature of the cold plate 1102 may prevent the liquid coolant and/or the vapor coolant from contacting the braze joint of the cold 1102, thereby protecting the braze joint from galvanic corrosion that may occur due to the liquid coolant and/or the vapor coolant contacting the braze joint.

The cold plate 1102 may be thermally coupled to the component 1106. As the component 1106 generates heat, the cold plate 1102 may receive the heat generated by component 1106. The liquid coolant and/or the vapor coolant circulated through the cavity of the cold plate 1102 may receive the heat and carry the heat, via the first coolant tube 1108 and/or the second coolant tube 1110, to the heat exchanger, fan, air conditioner, or other coolant element to dissipate the heat.

Figure 14:
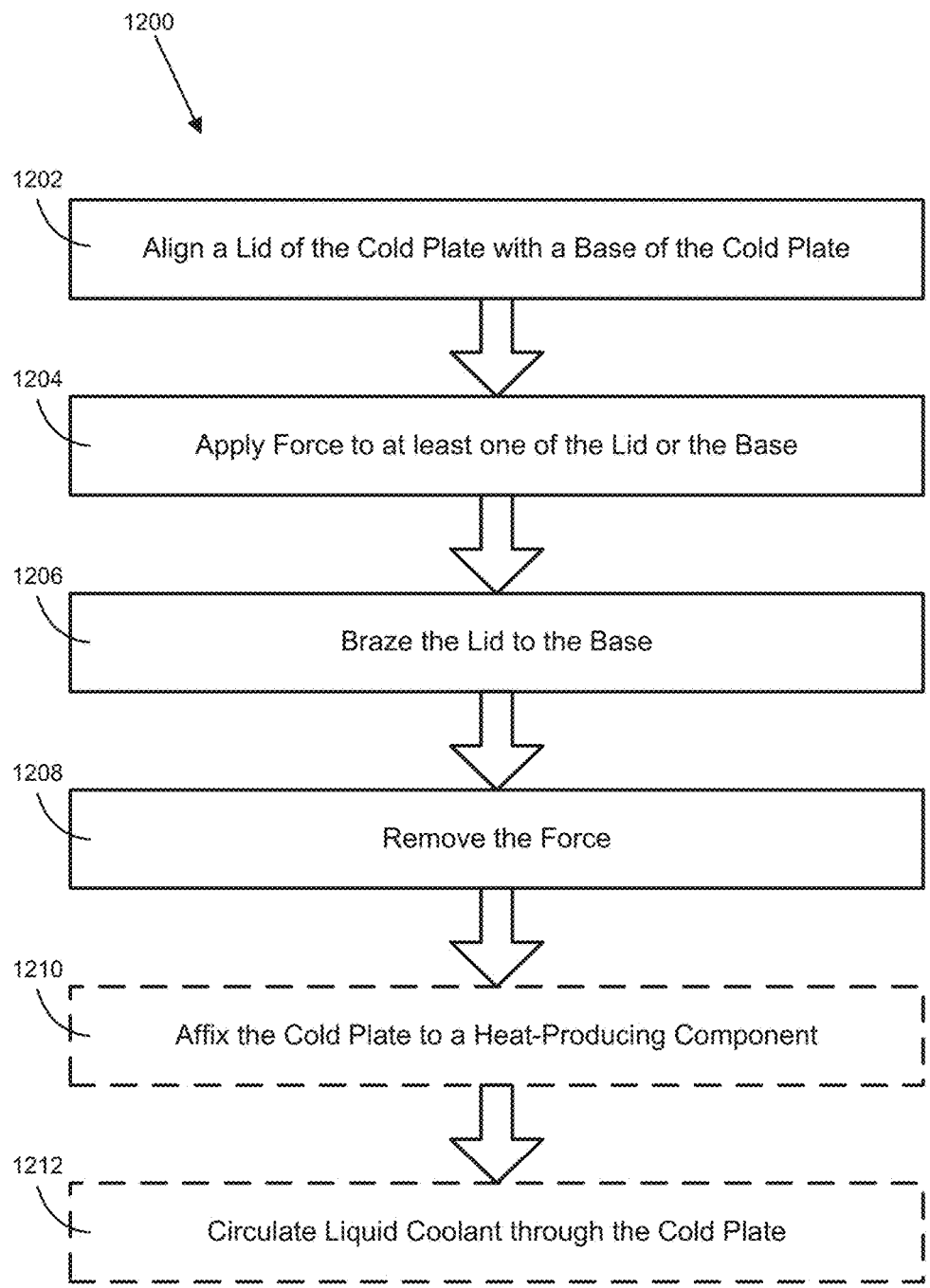
FIG. 14 illustrates an example procedure for generating a cold plate, according to various embodiments.

FIG. 14 illustrates an example procedure 1200 for generating a cold plate, according to various embodiments. The cold plate may include one or more of the features of the cold plate 100 (FIG. 1), the cold plate 900 (FIG. 10), the cold plate 1400 (FIG. 11), the cold plate 1000 (FIG. 12), the cold plate 1102 (FIG. 13), or some combination thereof.

In stage 1202, a lid of the cold plate may be aligned with a base of the cold plate. Aligning the lid with the base may include the lid and the base being aligned as described in relation to the lid 102 and the base 104 as illustrated in FIG. 3. Aligning the lid with the base may include aligning a first surface of a side of the lid (such as the first surface 302 (FIG. 3) and/or the first surface 1008 (FIG. 12)) with a first surface of a side of the base (such as the first surface 202 (FIG. 3) and/or the first surface 1010 (FIG. 12)). The first surface of the side of the lid may be located along a perimeter of the lid. Aligning the lid with the base may further include aligning a second surface of the side of the lid (such as the second surface 304 (FIG. 3) and/or the second surface 1014 (FIG. 12)) with a second surface of a the side of the base (such as the second surface 204 (FIG. 3) and/or the second surface 1016 (FIG. 12)). In some embodiments, aligning the lid with the base may further include aligning fins of the base (such as the fins 210 (FIG. 3)) with a recess formed in the side of the lid (such as recess 308 (FIG. 3)).

In stage 1204, a force may be applied to at least one of the lid or the base to compress the side of the lid against the side of the base. The force applied to the lid or the base may be at least 300 pound-force (or approximately 1334 newtons).

Compressing the lid against the side of the base may cause a seal feature of the lid (such as the seal feature 312 (FIG. 3), the first seal feature and the second seal feature described in relation to FIG. 10, and/or the seal feature described in relation to FIG. 12) to be compressed against the side of the base and deform to the side of the base. A dam (such as the dam 704 (FIG. 7), the first dam 902 (FIG. 10), the second dam 904 (FIG. 10), and/or the dam 1012 (FIG. 12)) may be formed by deforming the seal feature to the side of the base. Further, deforming the seal feature to the side of the base may enclose the recess formed in the lid, thereby generating a cavity between the lid and the base (such as the cavity 702 (FIG. 7), the cavity 914 (FIG. 10), and/or the cavity 1018 (FIG. 12)).

In stage 1206, the lid may be brazed to the base. Brazing the lid to the base may form a braze joint (such as the braze joint 106 (FIG. 1), and/or the braze joint 1006 (FIG. 12)) and the lid and based, where the braze joint may affix the lid to the base. Brazing the lid to the base may be performed by any process known by one having skill in the art and/or described throughout this disclosure for brazing two metal components together. The braze joint may be formed along a perimeter of the lid. In some embodiments, the braze joint may be formed along a braze portion of the base (such as the braze portion 502 (FIG. 5)). The braze joint may affix the first surface on the side of the lid to the first surface on the side of the base. Brazing the lid to the base may be performed with a brazing material that is different than a material that forms the lid and the base, thereby generating a braze joint of a different material than the material that forms the lid and the base. The material of the braze joint may occupy a different position in the galvanic series than the material that forms the lid and the base.

In stage 1208, the force may be removed from the at least one of the lid or the base. The braze joint may continue to maintain the lid against the base. The seal feature may remain compressed against the side of the base after the pressure is removed, thereby remaining as the dam after the force is removed.

The procedure 1200 may be completed at stage 1208 to generate the cold plate. In some embodiments, the procedure 1200 may continue with stage 1210 and stage 1212 to install the cold plate within an electrical system, such as the electrical system 1100 (FIG. 13).

In stage 1210, the cold plate may be affixed to a heat-producing component (such as the component 1106 (FIG. 13)). The cold plate may be affixed to the heat-producing component by any means of affixing a cold plate to a component known to one having ordinary skill in the art, including, but not limited to, thermal epoxy, mounting hardware, and/or application of pressure to press and maintain the cold plate against the component.

In stage 1212, liquid coolant can be circulated through the cold plate. Circulating the liquid coolant through the cold plate may include coupling one or more coolant tubes (such as the first coolant tube 1108 (FIG. 13) and/or the second coolant tube 1110 (FIG. 13)) to the cold plate. The coolant tubes may be coupled to one or more apertures formed in the cold plate (such as the first aperture 108 (FIG. 1) and/or the second aperture 110 (FIG. 1)). The coolant tubes may carry the liquid coolant to and from the cold plate causing the liquid coolant to be circulated through the cavity of the cold plate. In some embodiments, vapor coolant may be circulated through the cold plate via the coolant tubes in addition to, or in lieu of, the liquid coolant.

In alternate embodiments, some of the operations of procedure 1200 may be combined, divided, omitted, or performed in different orders.

Figure 15:
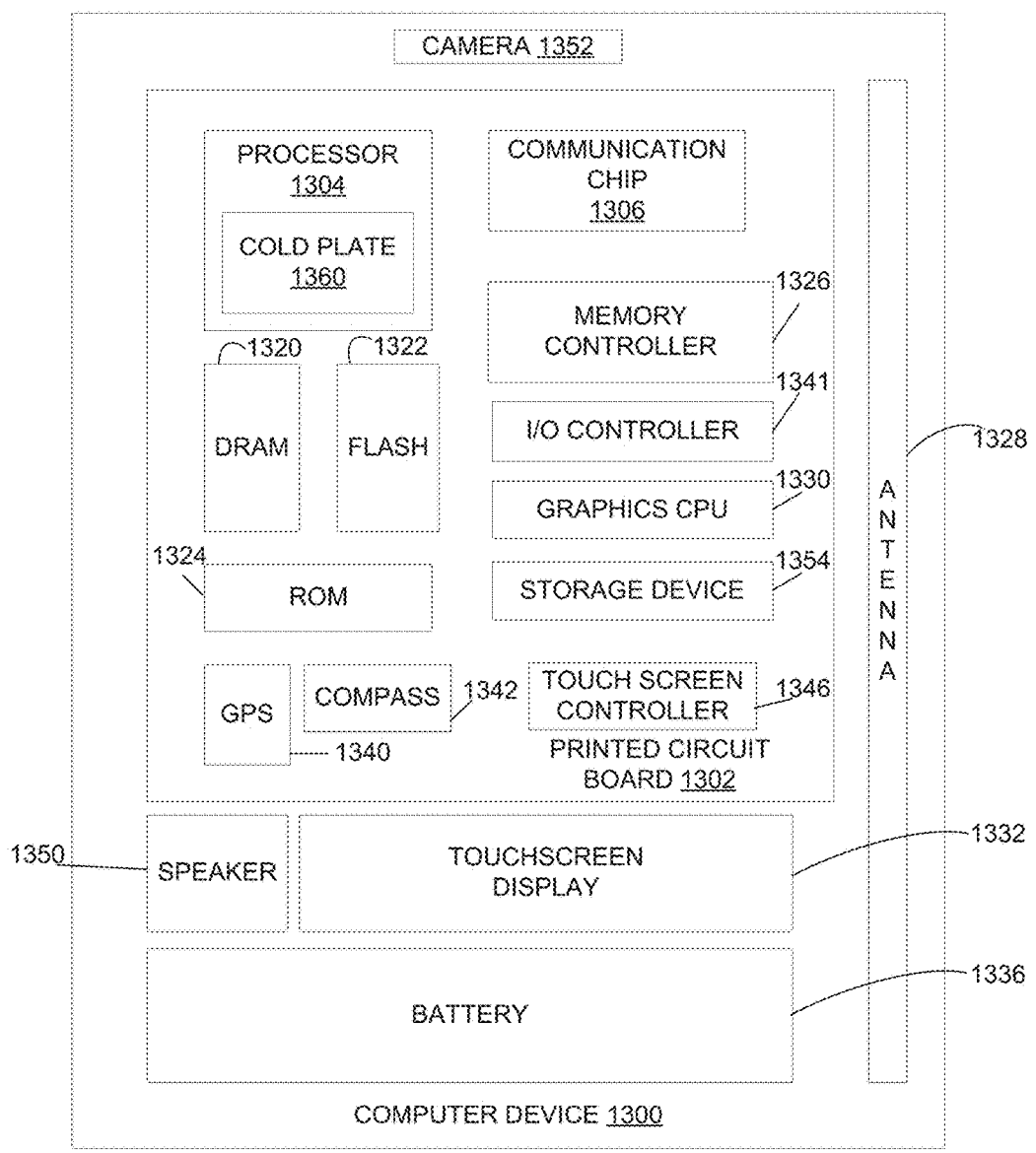
FIG. 15 illustrates an example computing device that may employ the apparatuses and/or methods described herein.

FIG. 15 illustrates an example computer device 1300 that may employ the apparatuses and/or methods described herein (e.g., the cold plate 100, the cold plate 900, the cold plate 1000, the electrical system 1100, and/or the procedure 1200), in accordance with various embodiments. As shown, computer device 1300 may include a number of components, such as one or more processor(s) 1304 (one shown) and at least one communication chip 1306. In various embodiments, the one or more processor(s) 1304 each may include one or more processor cores. In various embodiments, the at least one communication chip 1306 may be physically and electrically coupled to the one or more processor(s) 1304. In further implementations, the communication chip 1306 may be part of the one or more processor(s) 1304. In various embodiments, computer device 1300 may include printed circuit board (PCB) 1302. For these embodiments, the one or more processor(s) 1304 and communication chip 1306 may be disposed thereon. In alternate embodiments, the various components may be coupled without the employment of PCB 1302.

Depending on its applications, computer device 1300 may include other components that may or may not be physically and electrically coupled to the PCB 1302. These other components include, but are not limited to, memory controller 1326, volatile memory (e.g., dynamic random access memory (DRAM) 1320), non-volatile memory such as read only memory (ROM) 1324, flash memory 1322, storage device 1354 (e.g., a hard-disk drive (HDD)), an I/O controller 1341, a digital signal processor (not shown), a crypto processor (not shown), a graphics processor 1330, one or more antenna 1328, a display (not shown), a touch screen display 1332, a touch screen controller 1346, a battery 1336, an audio codec (not shown), a video codec (not shown), a global positioning system (GPS) device 1340, a compass 1342, an accelerometer (not shown), a gyroscope (not shown), a speaker 1350, a camera 1352, and a mass storage device (such as hard disk drive, a solid state drive, compact disk (CD), digital versatile disk (DVD)) (not shown), and so forth.

In some embodiments, the one or more processor(s) 1304, flash memory 1322, and/or storage device 1354 may include associated firmware (not shown) storing programming instructions configured to enable computer device 1300, in response to execution of the programming instructions by one or more processor(s) 1304, to practice all or selected aspects of the methods described herein. In various embodiments, these aspects may additionally or alternatively be implemented using hardware separate from the one or more processor(s) 1304, flash memory 1322, or storage device 1354.

In various embodiments, the computer device 1300 may include a cold plate 1360 coupled to a heat-producing component of the computer device 1300. The cold plate 1360 may include one or more of the features of the cold plate 100 (FIG. 1), the cold plate 900 (FIG. 10), the cold plate 1400 (FIG. 11), the cold plate 1000 (FIG. 12), and/or the cold plate 1102 (FIG. 13). The cold plate 1360 may be coupled to a coolant system and may transfer heat away from the heat-producing component to cool the heat-producing component. The cold plate 1360 is illustrated coupled to the processor 1304, however, it is to be understood that the cold plate 1360 may be coupled to any heat-producing component of the computer device 1300, including, but not limited to, the communication chip 1306, the memory controller 1326, the I/O controller 1341, the graphics CPU 1330, the storage device 1354, the touch screen controller 1346, the DRAM 1320, the flash memory 1322, and/or the ROM 1324.

The communication chips 1306 may enable wired and/or wireless communications for the transfer of data to and from the computer device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to IEEE 902.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

In various implementations, the computer device 1300 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1300 may be any other electronic device that processes data.

Example 1 may include a cold plate, comprising a base, and a lid affixed to the base via a braze joint, wherein the braze joint extends around a perimeter of the lid, and wherein a first one of the lid or the base includes a dam having a perimeter located inside of the perimeter of the lid, wherein the dam is compressed against a second one of the lid or the base and is liquid-tight to the second one of the lid or the base, and wherein a cavity is located between the base and the lid within the perimeter of the dam to provide a circulation passage for a liquid coolant.

Example 2 may include the cold plate of examples 1 or 2, wherein the base includes one or more fins that extend from a side of the base into the cavity, wherein the lid is affixed to the side of the base.

Example 3 may include the cold plate of examples 1 or 2, wherein a pressure at which the dam is compressed against the second one of the lid or the base is greater than a pressure at which the liquid coolant is circulated through the cavity.

Example 4 may include the cold plate of examples 1 or 2, wherein a portion of the second one of the lid or the base to which the dam is compressed has a roughness of less than 63 micro inches.

Example 5 may include the cold plate of examples 1 or 2, wherein a portion of the second one of the lid or the base to which the dam is compressed has a flatness of less than 0.002 inches.

Example 6 may include the cold plate of examples 1 or 2, wherein the base and the lid are formed of a first material, and wherein the braze joint is formed of a second material that is different than the first material.

Example 7 may include the cold plate of example 6, wherein the first material occupies a different position in a galvanic series than the second material.

Example 8 may include the cold plate of examples 1 or 2, wherein the base includes a first side and a second side opposite to the first side, wherein the lid is affixed to the first side of the base, wherein the first side of the base includes a first surface and a second surface, wherein the second surface is further from the second side than the first surface is from the second side, and wherein the braze joint affixes the lid to the first surface and the dam is compressed against the second surface.

Example 9 may include the cold plate of example 8, wherein the first surface is parallel to the second surface.

Example 10 may include the cold plate of examples 1 or 2, wherein the cavity is a first cavity, and wherein a second cavity is located between the base and the lid in an area between the perimeter of the lid and the perimeter of the dam.

Example 11 may include the cold plate of examples 1 or 2, wherein the dam is a first dam, and wherein the first one of the lid or the base further comprises a second dam located between the first dam and the perimeter of the lid, and wherein the second dam is compressed against the second one of the lid or the base.

Example 12 may include the cold plate of examples 1 or 2, wherein the dam is formed by compression of a seal feature of the first one of the lid or the base against the second one of the lid or the base, wherein the seal feature extends along where the perimeter of the dam is formed, and wherein the seal feature is deformed to the second one of the lid or the base when compressed.

Example 13 may include the cold plate of example 12, wherein the seal feature extends from a surface of first one of the lid or the base, and wherein the seal feature narrows as the seal feature extends further from the surface.

Example 14 may include the cold plate of example 12, wherein a size of the seal feature is selected based on a size of the lid.

Example 15 may include the cold plate of example 12, wherein a size of the seal feature is selected based on a pressure of which the liquid coolant is circulated.

Example 16 may include the cold plate of example 12, wherein the seal feature is resilient and is to spring back to an original shape in response to the seal feature being decompressed from against the second one of the lid or the base.

Example 17 may include the cold plate of examples 1 or 2, wherein the lid includes the dam.

Example 18 may include a method of generating a cold plate, comprising aligning a lid of the cold plate with a base of the cold plate, applying force to at least one of the lid or the base to compress a side of the lid against a side of the base, wherein compressing the side of the lid against the side of the base causes a seal feature of a first one of the lid or the base, which extends toward a second one of the lid or the base when the lid and base are aligned, to be compressed against the second one of the lid or the base and deformed to the second one of the lid or the base, and wherein the seal feature encloses a cavity formed between the lid and base when the seal feature is compressed against the second one of the lid or the base, brazing the lid to the base along a perimeter of the lid, wherein a perimeter of the seal feature is inside of the perimeter of the lid, and removing the force from the at least one of the lid or the base, wherein the seal feature remains compressed against the second one of the lid or the base after the force is removed.

Example 19 may include the method of example 18, wherein aligning the lid with the base includes aligning a first surface of the side of the lid with a first surface of the side of the base, the first surface of the side of the lid along the perimeter of the lid, aligning a second surface of the side of the lid with a second surface of the side of the base, wherein a first distance exists between the first surface of the side of the lid and the second surface of the side of the lid and a second distance exists between the first surface of the side of the base and the second surface of the side of the base, wherein the first distance is greater than the second distance, wherein the seal feature extends from a first one of the second surface of the side of the lid or the second surface of the side of the base toward a second one of the second surface of the side of the lid or the second surface of the side of the base, and wherein a distance that the seal feature extends from the first one of the second surface of the side of the lid or the second surface of the side of the base is greater than a difference between the first distance and the second distance.

Example 20 may include the method of examples 18 or 19, wherein the lid and the base are formed of a first material, and wherein the brazing is performed with a second material different than the first material.

Example 21 may include the method of example 20, wherein the first material occupies a different position in a galvanic series than the second material.

Example 22 may include the method of examples 18 or 19, wherein the base includes one or more fins extending from the side of the base, wherein aligning the lid with the base includes aligning the one or more fins with a recess in the side of the lid, and wherein the one or more fins become located within the cavity formed of the recess when the seal feature encloses the cavity.

Example 23 may include the method of examples 18 or 19, wherein the force applied to the at least one of the lid or the base is at least 300 pound-force.

Example 24 may include the method of examples 18 or 19, wherein the seal feature remains compressed against the second one of the lid or the base at a pressure greater than a pressure at which liquid coolant is circulated through the cavity.

Example 25 may include the method of examples 18 or 19, further comprising affixing the cold plate to a heat-producing component mounted to a circuit board within a system, and circulating liquid coolant through the cold plate to cool the heat-producing component.

Example 26 may include the method of examples 18 or 19, wherein the lid includes the seal feature.

Example 27 may include a system, comprising a circuit board, a component mounted to the circuit board, the component to produce heat during operation of the component, and a cold plate affixed to the component, the cold plate to conduct the heat away from the component, wherein cold plate comprises a base, and a lid affixed to the base via a braze joint, wherein the braze joint extends around a perimeter of the lid, and wherein a first one of the lid or the base includes a dam having a perimeter located inside of the perimeter of the lid, wherein the dam is compressed against a second one of the lid or the base and is liquid-tight to the second one of the lid or the base, and wherein a cavity is located between the base and the lid within the perimeter of the dam to provide a circulation passage for a liquid coolant.

Example 28 may include the system of example 27, wherein the base includes one or more fins that extend from a side of the base into the cavity, wherein the lid is affixed to the side of the base.

Example 29 may include the system of example 27, wherein a pressure at which the dam is compressed against the second one of the lid or the base is greater than a pressure at which the liquid coolant is circulated through the cavity.

Example 30 may include the system of any of the examples 27-29, wherein a portion of the second one of the lid or the base to which the dam is compressed has a roughness of less than 63 micro inches.

Example 31 may include the system of any of the examples 27-29, wherein a portion of the second one of the lid or the base to which the dam is compressed has a flatness of less than 0.002 inches.

Example 32 may include the system of any of the examples 27-29, wherein the base and the lid are formed of a first material, and wherein the braze joint is formed of a second material that is different than the first material.

Example 33 may include the system of example 32, wherein the first material occupies a different position in a galvanic series than the second material.

Example 34 may include the system of any of the examples 27-29, wherein the base includes a first side and a second side opposite to the first side, wherein the lid is affixed to the first side of the base, wherein the first side of the base includes a first surface and a second surface, wherein the second surface is further from the second side than the first surface is from the second side, and wherein the braze joint affixes the lid to the first surface and the dam is compressed against the second surface.

Example 35 may include the system of example 34, wherein the first surface is parallel to the second surface.

Example 36 may include the system of any of the examples 27-29, wherein the cavity is a first cavity, and wherein a second cavity is located between the base and the lid in an area between the perimeter of the lid and the perimeter of the dam.

Example 37 may include the system of any of the examples 27-29, wherein the dam is a first dam, and wherein the lid further comprises a second dam located between the first dam and the perimeter of the lid, and wherein the second dam is compressed against the second one of the lid or the base.

Example 38 may include the system of any of the examples 27-29, wherein the dam is formed by compression of a seal feature of the first one of the lid or the base against the second one of the lid or the base, wherein the seal feature extends along where the perimeter of the dam is formed, and wherein the seal feature is deformed to the second one of the lid or the base when compressed.

Example 39 may include the system of example 38, wherein the seal feature extends from a surface of the first one of the lid or the base, and wherein the seal feature narrows as the seal feature extends further from the surface.

Example 40 may include the system of example 38, wherein a size of the seal feature is selected based on a size of the lid.

Example 41 may include the system of example 38, wherein a size of the seal feature is selected based on a pressure of which the liquid coolant is circulated.

Example 42 may include the system of example 38, wherein the seal feature is resilient and is to spring back to an original shape in response to the seal feature being decompressed from against the second one of the lid or the base.

Example 43 may include the system of any of the examples 27-29, wherein the lid includes the dam.

Example 44 may include a cold plate, comprising a base, a lid, and means for affixing the lid to the base, wherein the means for affixing the lid to the base extends around a perimeter of the lid, and wherein a first one of the lid or the base includes a means for isolating liquid coolant to be circulated within a cavity located between the base and the lid, wherein the means for isolating the liquid coolant is compressed against a second one of the lid or the base and is liquid-tight to the second one of the lid or the base, and wherein the means for isolating the liquid coolant has a perimeter located inside of the perimeter of the lid.

Example 45 may include the cold plate of example 44, wherein the base and the lid are formed of a first material, and wherein the means for affixing the lid to the base is formed of a second material that is different than the first material.

Example 46 may include the cold plate of example 45, wherein the first material occupies a different position in a galvanic series than the second material.

Example 47 may include the cold plate of any of the examples 44-46, wherein the means for affixing the lid to the base includes a braze joint that extends around the perimeter of the lid.

Example 48 may include the cold plate of any of the examples 44-46, wherein a pressure at which the means for isolating the liquid coolant is compressed against the second one of the lid or the base is greater than a pressure at which the liquid coolant is circulated through the cavity.

Example 49 may include the cold plate of any of the examples 44-46, wherein a portion of the second one of the lid or the base to which the means for isolating the liquid coolant is compressed has a roughness of less than 63 micro inches.

Example 50 may include the cold plate of any of the examples 44-46, wherein a portion of the second one of the lid or the base to which the means for isolating the liquid coolant is compressed has a flatness of less than 0.002 inches.

Example 51 may include the cold plate of any of the claims 44-46, wherein the lid includes the means for isolating liquid coolant.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A cold plate, comprising: a base; and a lid affixed to the base via a braze joint, wherein the braze joint extends around a perimeter of the lid, and wherein one of the lid or the base includes: a dam having a perimeter located inside of the perimeter of the lid, wherein the dam is compressed against another of the lid or the base and is liquid-tight to the other of the lid or the base, wherein the dam is unitary with the lid or the base, and wherein a cavity is located between the base and the lid within the perimeter of the dam to provide a circulation passage for a liquid coolant; wherein the base includes a first side and a second side opposite to the first side, wherein the lid is affixed to the first side of the base, wherein the first side of the base includes a first surface and a second surface, wherein the second surface is further from the second side than the first surface is from the second side, and wherein the braze joint affixes the lid to the first surface and the dam is compressed against the second surface.

2. The cold plate of claim 1, wherein the base includes one or more fins that extend from a side of the base into the cavity, wherein the lid is affixed to the side of the base.

3. The cold plate of claim 1, wherein a pressure at which the dam is compressed against the other of the lid or the base is greater than a pressure at which the liquid coolant is circulated through the cavity.

4. The cold plate of claim 1, wherein a portion of the other of the lid or the base to which the dam is compressed has a roughness of less than 63 micro inches.

5. The cold plate of claim 1, wherein a portion of the other of the lid or the base to which the dam is compressed has a flatness of less than 0.002 inches.

6. The cold plate of claim 1, wherein the base and the lid are formed of a first material, and wherein the braze joint is formed of a second material that is different than the first material.

7. The cold plate of claim 6, wherein the first material occupies a different position in a galvanic series than the second material.

8. The cold plate of claim 1, wherein the first surface is parallel to the second surface.

9. The cold plate of claim 1, wherein the cavity is a first cavity, and wherein a second cavity is located between the base and the lid in an area between the perimeter of the lid and the perimeter of the dam.

10. A method of generating a cold plate, comprising: aligning a lid of the cold plate with a base of the cold plate; wherein the base includes a first side and a second side opposite to the first side, applying force to at least one of the lid or the base to compress a side of the lid against the first or second side of the base, wherein compressing the side of the lid against the first or second side of the base causes a seal feature of a first one of the lid or the base, which extends toward a second one of the lid or the base when the lid and base are aligned, to be compressed against the second one of the lid or the base and deformed to the second one of the lid or the base, and wherein the seal feature encloses a cavity formed between the lid and base when the seal feature is compressed against the second one of the lid or the base and wherein the seal feature is unitary with the first one of the lid or base: brazing the lid to the base along a perimeter of the lid, wherein a perimeter of the seal feature is inside of the perimeter of the lid; and removing the force from the at least one of the lid or the base, wherein the seal feature remains compressed against the second one of the lid or the base after the force is removed; wherein the lid is affixed to the first side of the base, wherein the first side of the base includes a first surface and a second surface, wherein the second surface is further from the second side of the base than the first surface is from the second side, and wherein the braze joint affixes the lid to the first surface and the dam is compressed against the second surface.

11. The method of claim 10, wherein the lid and the base are formed of a first material, and wherein the brazing is performed with a second material different than the first material.

12. The method of claim 11, wherein the first material occupies a different position in a galvanic series than the second material.

13. A system, comprising: a circuit board; a component mounted to the circuit board, the component to produce heat during operation of the component; and a cold plate affixed to the component, the cold plate to conduct the heat away from the component, wherein cold plate comprises: a base; and a lid affixed to the base via a braze joint, wherein the braze joint extends around a perimeter of the lid, and wherein one of the lid or the base includes: a dam having a perimeter located inside of the perimeter of the lid, wherein the dam is compressed against another of the lid or the base and is liquid-tight to the other of the lid or the base, wherein the dam is unitary with the lid or the base, and wherein a cavity is located between the base and the lid within the perimeter of the dam to provide a circulation passage for a liquid coolant; wherein the base includes a first side and a second side opposite to the first side, wherein the lid is affixed to the first side of the base, wherein the first side of the base includes a first surface and a second surface, wherein the second surface is further from the second side than the first surface is from the second side, and wherein the braze joint affixes the lid to the first surface and the dam is compressed against the second surface.

14. The system of claim 13, wherein the base includes one or more fins that extend from a side of the base into the cavity, wherein the lid is affixed to the side of the base.

15. The system of claim 13, wherein a pressure at which the dam is compressed against the second one of the lid or the base is greater than a pressure at which the liquid coolant is circulated through the cavity.

16. The system of claim 13, wherein a portion of the other of the lid or the base to which the dam is compressed has a roughness of less than 63 micro inches.

17. The system of claim 13, wherein the base and the lid are formed of a first material, and wherein the braze joint is formed of a second material that is different than the first material.

18. The system of claim 17, wherein the first material occupies a different position in a galvanic series than the second material.

* * * * *